(12) United States Patent
Goto

(10) Patent No.: US 12,261,591 B2
(45) Date of Patent: Mar. 25, 2025

(54) TEMPERATURE COMPENSATED SURFACE ACOUSTIC WAVE DEVICES WITH MULTIPLE BURIED MASS LOADING STRIPS

(71) Applicant: SKYWORKS SOLUTIONS, INC., Irvine, CA (US)

(72) Inventor: Rei Goto, Osaka (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 304 days.

(21) Appl. No.: 18/061,099

(22) Filed: Dec. 2, 2022

(65) Prior Publication Data

US 2023/0198503 A1    Jun. 22, 2023

Related U.S. Application Data

(60) Provisional application No. 63/292,203, filed on Dec. 21, 2021.

(51) Int. Cl.
*H03H 9/64* (2006.01)
*H03H 9/02* (2006.01)

(52) U.S. Cl.
CPC ...... *H03H 9/6489* (2013.01); *H03H 9/02574* (2013.01); *H03H 9/02661* (2013.01)

(58) Field of Classification Search
CPC ........... H03H 9/02574; H03H 9/14541; H03H 9/02818; H03H 9/02834; H03H 9/02661; H03H 9/6489

See application file for complete search history.

(56) References Cited

U.S. PATENT DOCUMENTS

| | | |
|---|---|---|
| 7,939,989 B2 | 5/2011 | Solal et al. |
| 8,896,399 B2 | 11/2014 | Miura et al. |
| 9,035,725 B2 | 5/2015 | Komatsu et al. |
| 9,099,982 B2 | 8/2015 | Adkisson et al. |
| 9,473,108 B2 | 10/2016 | Nakamura et al. |

(Continued)

FOREIGN PATENT DOCUMENTS

CN    111510106 A    8/2020

OTHER PUBLICATIONS

International Search Report and Written Opinion from corresponding International Application No. PCT/US2022/051940 dated Apr. 5, 2023.

*Primary Examiner* — Quan Tra
(74) *Attorney, Agent, or Firm* — Lando & Anastasi, LLP

(57) ABSTRACT

An acoustic wave device comprises a substrate including a piezoelectric material, interdigital transducer (IDT) electrodes disposed on a surface of the substrate, a first dielectric film having a lower surface disposed on the IDT electrodes and the surface of the substrate, first strips formed of a first material having a density greater than a density of the first dielectric film disposed within the first dielectric film over tips of the interdigitated electrode fingers in the edge regions of the IDT electrodes, and second strips formed of a second material having a density greater than the density of the first dielectric film disposed within the first dielectric film in the gap regions of the IDT electrodes, laterally spaced from the first strips in a direction perpendicular to a direction of propagation of a main acoustic wave through the acoustic wave device, and extending only partially over the gap regions.

23 Claims, 37 Drawing Sheets

(56) References Cited

U.S. PATENT DOCUMENTS

| | | | |
|---|---|---|---|
| 9,640,750 B2 | 5/2017 | Nakanishi et al. | |
| 9,673,779 B2 | 6/2017 | Ruile et al. | |
| 9,748,924 B2 | 8/2017 | Komatsu et al. | |
| 10,469,050 B2 | 11/2019 | Gamble et al. | |
| 10,938,371 B2 | 3/2021 | Nakamura et al. | |
| 11,070,195 B2 | 7/2021 | Uesaka | |
| 2015/0123746 A1* | 5/2015 | Nakamura | H03H 9/02818 333/195 |
| 2016/0294359 A1* | 10/2016 | You | H03H 9/02818 |
| 2018/0054179 A1 | 2/2018 | Gamble et al. | |
| 2020/0162052 A1 | 5/2020 | Matsuoka et al. | |
| 2021/0067134 A1 | 3/2021 | Fujiwara | |
| 2021/0126612 A1 | 4/2021 | Hiramatsu et al. | |
| 2021/0376813 A1 | 12/2021 | Inoue et al. | |
| 2022/0360251 A1* | 11/2022 | Kay | H03H 9/205 |

* cited by examiner

TEMPERATURE COMPENSATED SURFACE ACOUSTIC WAVE DEVICES WITH MULTIPLE BURIED MASS LOADING STRIPS

CROSS-REFERENCE TO RELATED APPLICATIONS

This application claims priority under 35 U.S.C. § 119(e) to U.S. Provisional Patent Application Ser. No. 63/292,203, titled "TEMPERATURE COMPENSATED SURFACE ACOUSTIC WAVE DEVICES WITH MULTIPLE BURIED MASS LOADING STRIPS," filed Dec. 21, 2021, the entire contents of which is incorporated herein by reference for all purposes.

BACKGROUND

Technical Field

Embodiments of this disclosure relate to acoustic wave devices and to suppression of transverse mode spurious signals in same.

Description of Related Technology

Acoustic wave devices, for example, surface acoustic wave (SAW) and bulk acoustic wave (BAW) devices may be utilized as components of filters in radio frequency electronic systems. For instance, filters in a radio frequency front-end of a mobile phone can include acoustic wave filters. Two acoustic wave filters can be arranged as a duplexer.

SUMMARY

In accordance with one aspect, there is provided an acoustic wave device. The acoustic wave device comprises a substrate including a piezoelectric material, interdigital transducer (IDT) electrodes including interdigitated electrode fingers disposed on a surface of the substrate, the IDT electrodes having gap regions, edge regions, and bus bar regions, a first dielectric film having a lower surface disposed on the IDT electrodes and the surface of the substrate, first strips formed of a first material having a density greater than a density of the first dielectric film disposed within the first dielectric film over tips of the interdigitated electrode fingers in the edge regions of the IDT electrodes, and second strips formed of a second material having a density greater than the density of the first dielectric film disposed within the first dielectric film in the gap regions of the IDT electrodes, laterally spaced from the first strips in a direction perpendicular to a direction of propagation of a main acoustic wave through the acoustic wave device, and extending only partially over the gap regions to suppress high order spurious signals from being generated in the acoustic wave device.

In some embodiments, the first material is a same material as the second material.

In some embodiments, the first material and the second material are both metals.

In some embodiments, the first material and the second material are a same metal as a metal included in the IDT electrodes.

In some embodiments, the first material and the second material are different metals from a metal or metals included in the IDT electrodes.

In some embodiments, the first material and the second material are each dielectric materials.

In some embodiments, the second strips are narrower than the first strips.

In some embodiments, the second strips are laterally displaced from the first strips by a distance less than widths of the first strips.

In some embodiments, widths of the second strips are approximately the same as the distance.

In some embodiments, each of the first and second strips is disposed at a same height within the first dielectric film.

In some embodiments, the IDT electrodes further include min-bus bar electrodes and the second strips are disposed over the mini-bus bar electrodes.

In some embodiments, the acoustic wave device further comprises third strips formed of a third material having a density greater than the density of the first dielectric film disposed within the first dielectric film in the gap regions of the IDT electrodes, laterally spaced from the first strips and from the second strips in a direction perpendicular to the direction of propagation of the main acoustic wave through the acoustic wave device, a sum of the widths of second strips and third strips being less than a width of the gap region.

In some embodiments, the acoustic wave device further comprises fourth strips formed of a fourth material having a density greater than the density of the first dielectric film disposed within the first dielectric film in the gap regions of the IDT electrodes, laterally spaced from the first strips, the second strips, and the third strips in a direction perpendicular to the direction of propagation of the main acoustic wave through the acoustic wave device, a sum of the widths of second strips, third strips, and fourth strips being less than the width of the gap region.

In some embodiments, each of the first, second, third, and fourth materials is formed from a same material.

In some embodiments, the fourth strips have edges disposed at boundaries between the gap regions and the bus bar regions.

In some embodiments, each of the second, third, and fourth strips has a same width.

In some embodiments, each of the first, second, third, and fourth strips is laterally spaced from adjacent others of the first, second, third, and fourth strips by a same distance.

In some embodiments, at least two of the first, second, third, and fourth strips are disposed at a same height within the first dielectric film.

In some embodiments, each of the first, second, third, and fourth strips is disposed at a same height within the first dielectric film.

In some embodiments, the acoustic wave device further comprises a second dielectric film exhibiting a greater acoustic velocity than the first dielectric film disposed on the first dielectric film.

In some embodiments, the acoustic wave device is included in a radio frequency filter.

In some embodiments, the radio frequency filter is included in an electronics module.

In some embodiments, the electronics module is included in an electronic device.

BRIEF DESCRIPTION OF THE DRAWINGS

Embodiments of this disclosure will now be described, by way of non-limiting example, with reference to the accompanying drawings.

FIG. 5 for different values of separation distance between the high density strips of material and for different widths of the high density strips of material in the gap regions of the electrode structure;

DETAILED DESCRIPTION OF CERTAIN EMBODIMENTS

Figure 1A:
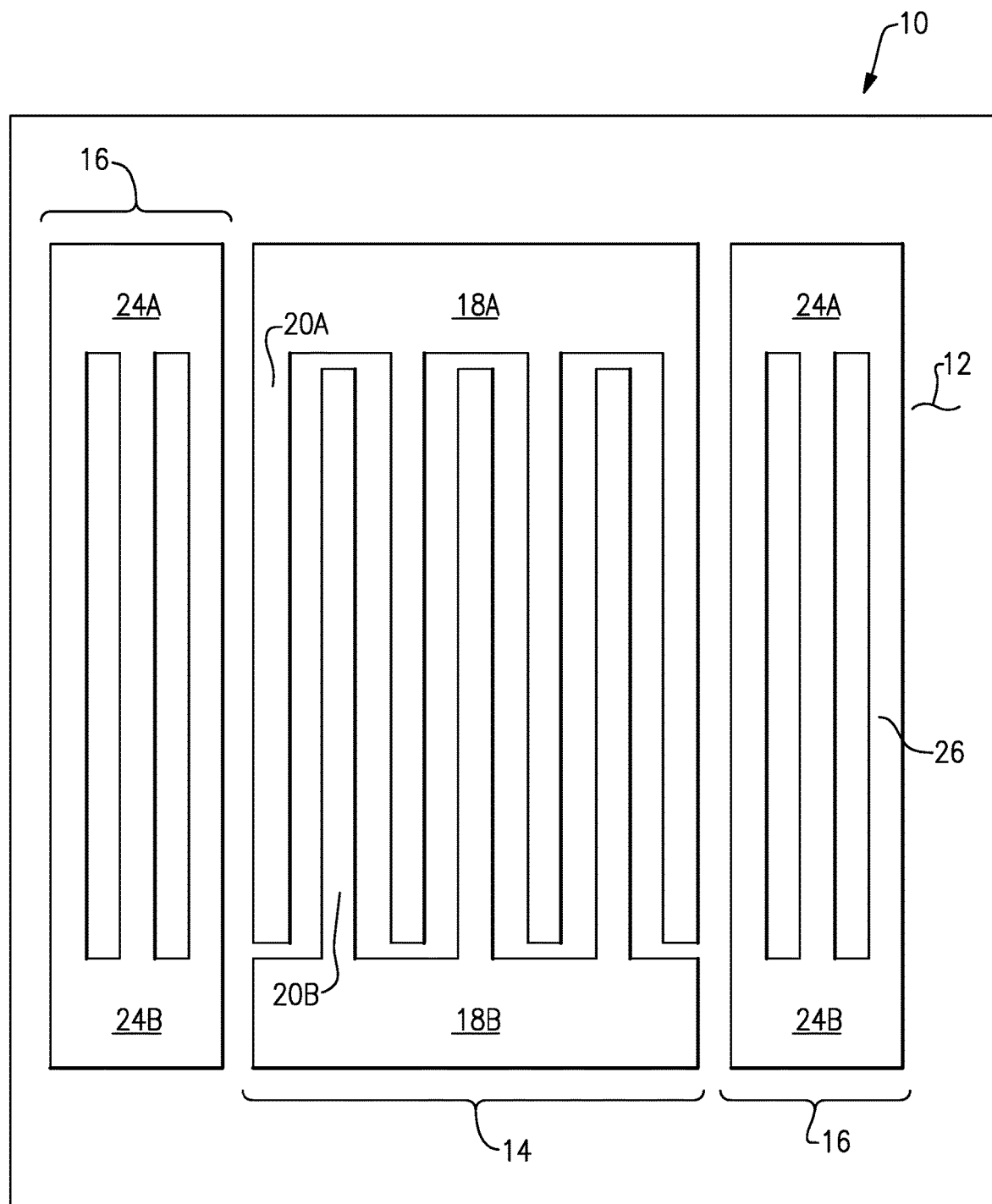
FIG. 1A is a simplified plan view of an example of a surface acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1A is a plan view of a surface acoustic wave (SAW) resonator 10 such as might be used in a SAW filter, duplexer, balun, etc.

Acoustic wave resonator 10 is formed on a piezoelectric substrate, for example, a lithium tantalate (LiTaO$_3$) or lithium niobate (LiNbO$_3$) substrate 12 and includes Interdigital Transducer (IDT) electrodes 14 and reflector electrodes 16. In use, the IDT electrodes 14 excite a main acoustic wave having a wavelength λ along a surface of the piezoelectric substrate 12. The reflector electrodes 16 sandwich the IDT electrodes 14 and reflect the main acoustic wave back and forth through the IDT electrodes 14. The main acoustic wave of the device travels perpendicular to the lengthwise direction of the IDT electrodes.

The IDT electrodes 14 include a first bus bar electrode 18A and a second bus bar electrode 18B facing first bus bar electrode 18A. The bus bar electrodes 18A, 18B may be referred to herein and labelled in the figures as busbar electrode 18. The IDT electrodes 14 further include first electrode fingers 20A extending from the first bus bar electrode 18A toward the second bus bar electrode 18B, and second electrode fingers 20B extending from the second bus bar electrode 18B toward the first bus bar electrode 18A.

The reflector electrodes 16 (also referred to as reflector gratings) each include a first reflector bus bar electrode 24A and a second reflector bus bar electrode 24B (collectively referred to herein as reflector bus bar electrode 24) and reflector fingers 26 extending between and electrically coupling the first bus bar electrode 24A and the second bus bar electrode 24B.

Figure 1B:
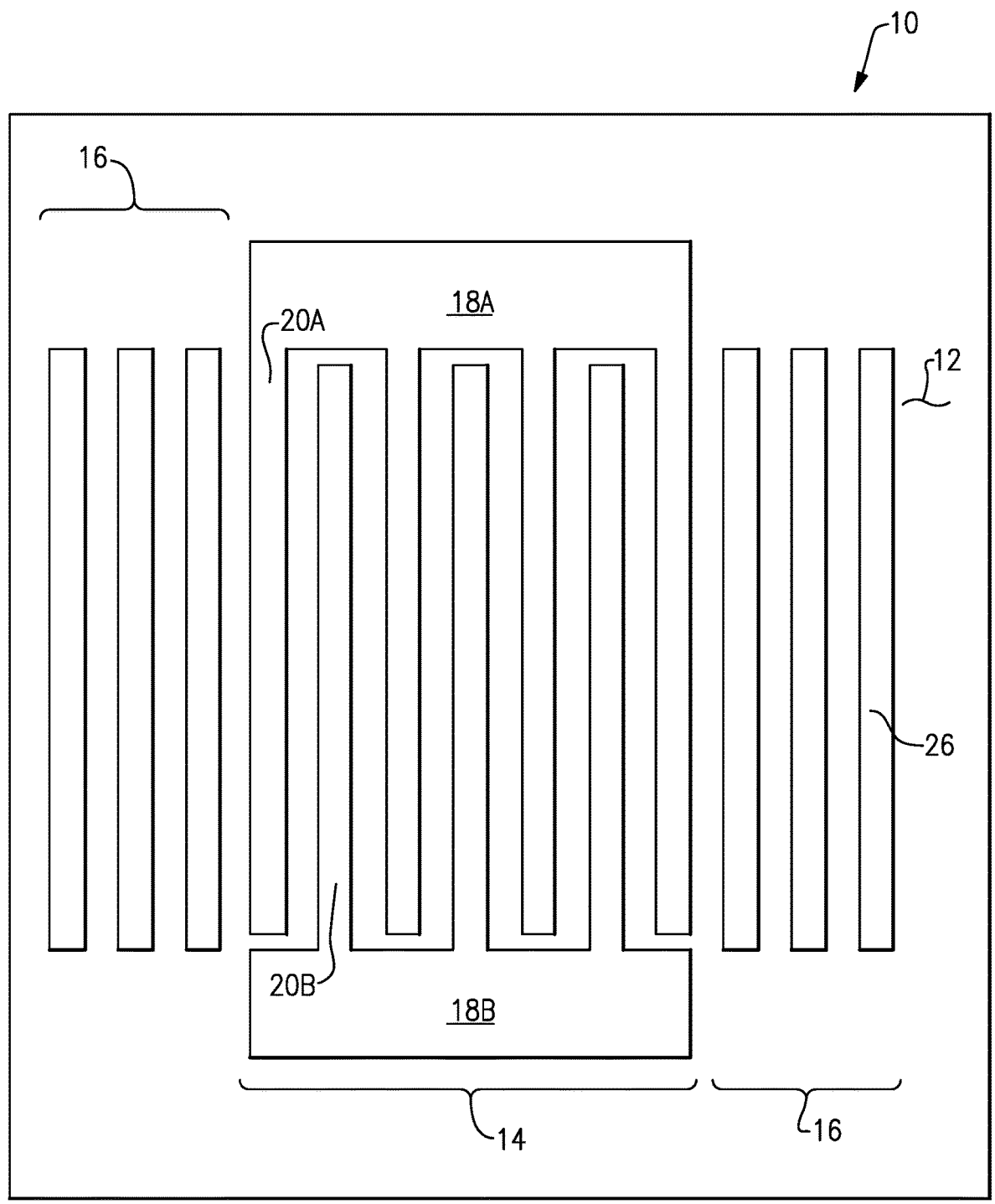
FIG. 1B is a simplified plan view of another example of a surface acoustic wave resonator.
Figure 1C:
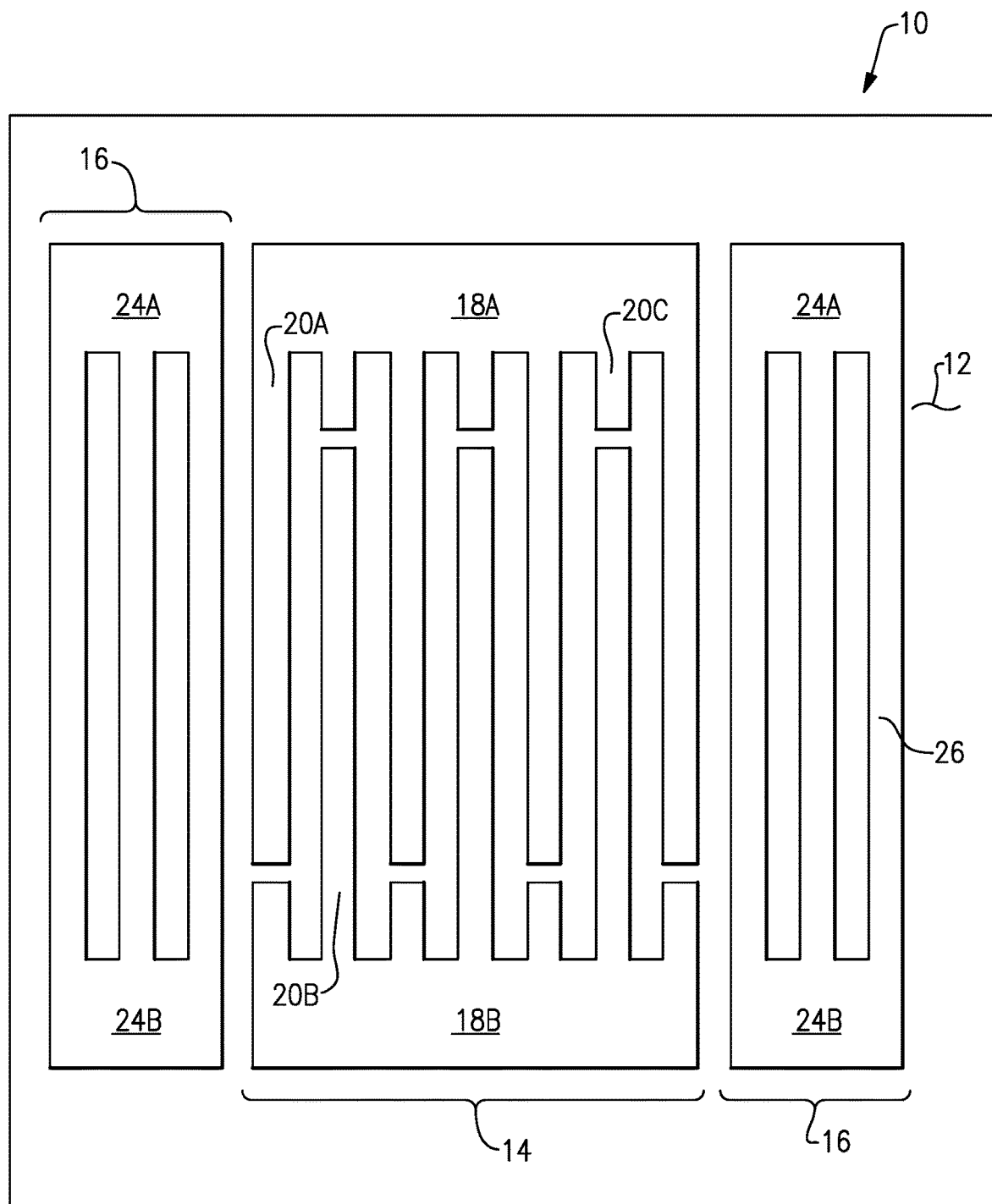
FIG. 1C is a simplified plan view of another example of a surface acoustic wave resonator.

In other embodiments disclosed herein, as illustrated in FIG. 1B, the reflector bus bar electrodes 24A, 24B may be omitted and the reflector fingers 26 may be electrically unconnected. Further, as illustrated in FIG. 1C, acoustic wave resonators as disclosed herein may include dummy electrode fingers 20C that are aligned with respective electrode fingers 20A, 20B. Each dummy electrode finger 20C extends from the opposite bus bar electrode 18A, 18B than the respective electrode finger 20A, 20B with which it is aligned.

Figure 1D:
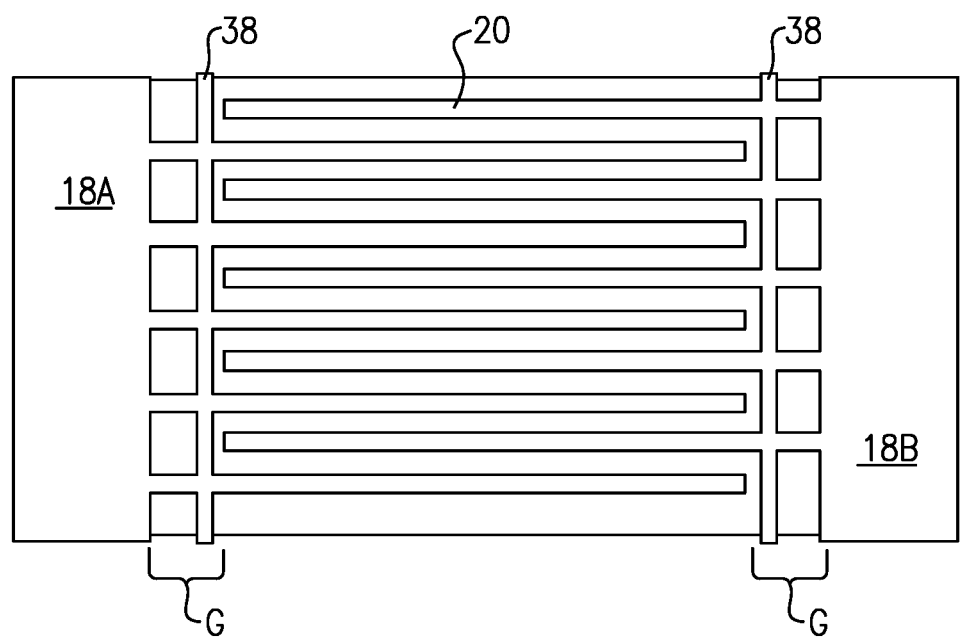
FIG. 1D is a simplified plan view of another example of a surface acoustic wave resonator.

In other embodiments, acoustic wave resonators as disclosed herein may further include mini-bus bar electrodes 38 as illustrated in FIG. 1D. The mini-bus bar electrodes 38 electrically connect electrode fingers 20 proximate the portions of the electrode fingers 20 attached to the busbar electrode 18A, 18B from which they extend. The mini-busbar electrodes are disposed in gap regions G between tips of the electrode fingers extending from one bus bar electrode 18A, 18B and the opposite bus bar electrode 18A, 18B. The mini-bus bar electrodes 38 may help reduce spurious mode signals in various embodiments of acoustic wave devices as disclosed herein.

It should be appreciated that the acoustic wave resonators 10 illustrated in FIGS. 1A-1D, as well as the other circuit elements illustrated in other figures presented herein, are illustrated in a highly simplified form. The relative dimensions of the different features are not shown to scale. Further, typical acoustic wave resonators would commonly include a far greater number of electrode fingers and reflector fingers than illustrated. Typical acoustic wave resonators or filter elements may also include multiple IDT electrodes sandwiched between the reflector electrodes.

Figure 2A:
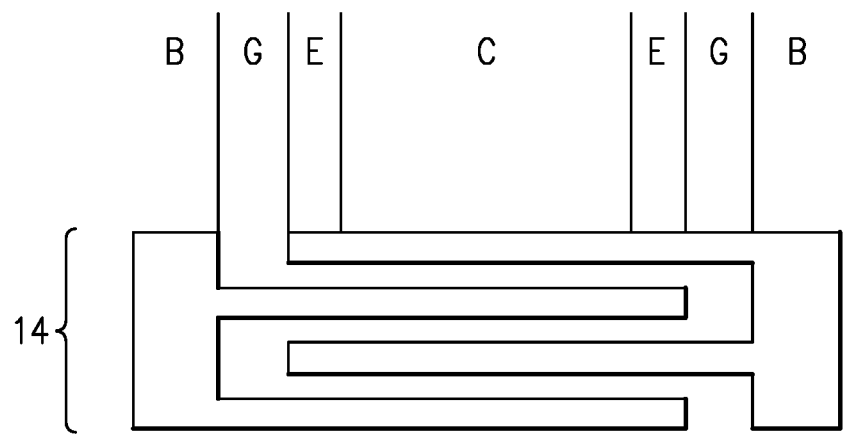
FIG. 2A is a plan view of a portion of electrodes of a surface acoustic wave resonator defining different regions of the electrode structure.
Figure 2B:
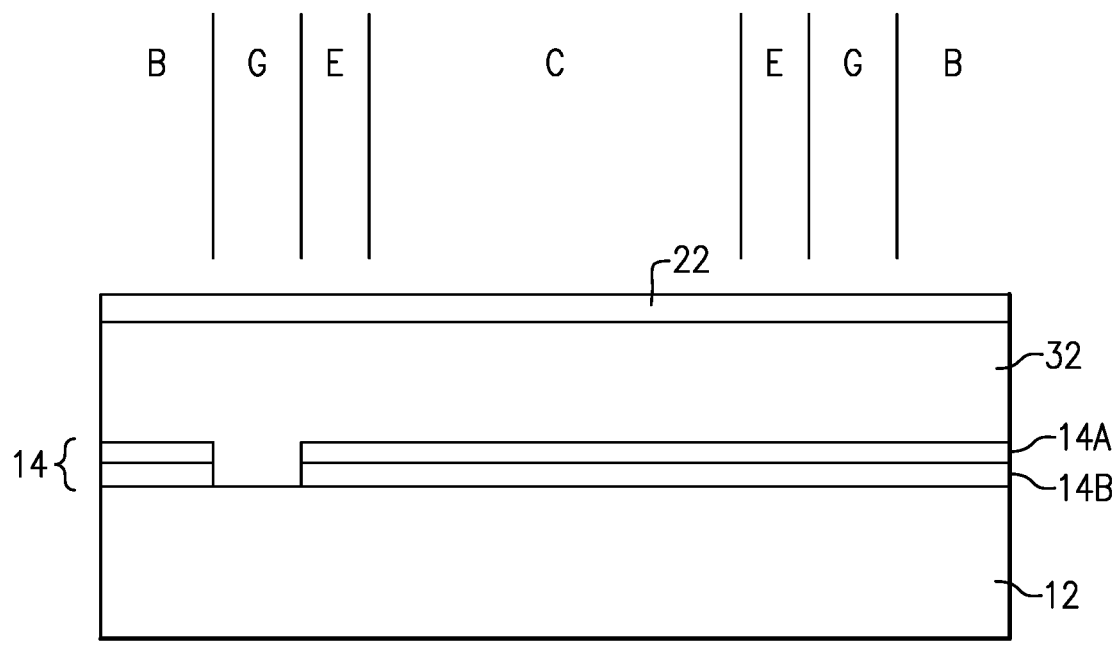
FIG. 2B is a cross-sectional view of a portion of a surface acoustic wave resonator defining the different regions of the electrode structure.

As illustrated in FIG. 2A, regions along lengths of the IDT electrodes of a SAW device, e.g., a SAW resonator, may be characterized as busbar regions "B" including the busbar portions of the IDT electrodes, gap regions "G" between the busbar of a first IDT electrode and the ends of the fingers extending from the busbar of a second IDT electrode of the SAW device (and vice-versa), edge regions "E" including end portions of the IDT electrode fingers, and a center region "C" sandwiched between the edge regions. In some embodiments, the gap regions may have widths of between about 1λ and 1.5λ, the edge regions may have widths of between about 0.5λ and 1λ, and the center region may have a width of about 20λ, although it should be understood that these dimensions are only examples and may vary based on the design of a particular resonator. In some embodiments, a layer of a dielectric 22 exhibiting a high acoustic wave velocity, for example, silicon nitride (Si$_3$N$_4$, also abbreviated as "SiN" herein) may be disposed over the IDT electrodes. In some embodiments, as illustrated in FIG. 2B, the layer of high acoustic wave velocity material 22 may be deposited over a dielectric material 32 having a lower acoustic wave velocity, for example, silicon dioxide (SiO$_2$) disposed over the entire IDT electrode structure (regions B, G, E, and C). It should be understood that the various embodiments of SAW resonators disclosed herein may each include both layers 22 and 32 although these layers may not be illustrated in all figures or discussed with respect to each embodiment.

The SiO$_2$ layer 32 may have a negative temperature coefficient of frequency, which helps to offset the positive temperature coefficient of frequency of the piezoelectric substrate 12 and reduce the change in frequency response of the SAW device with changes in temperature. A SAW device with a layer of SiO$_2$ over the IDT electrodes may thus be referred to as a temperature-compensated SAW device, or TCSAW.

As also illustrated in FIG. 2B, the IDT electrodes 14 may be layered electrodes including an upper layer 14A of a highly conductive but low-density material, for example, aluminum (Al), and a lower layer 14B of a less conductive, but more dense material, for example, molybdenum (Mo) or tungsten (W). The denser lower layer 14B may reduce the acoustic velocity of acoustic waves travelling through the device which may allow the IDT electrode fingers to be spaced more closely for a given operating frequency and allow the SAW device to be reduced in size as compared to a similar device utilizing less dense IDT electrodes. The less dense upper layer 14A may have a higher conductivity than the lower layer 14B to provide the electrode stack with a lower overall resistivity.

Consumers and device manufactures continue to demand electronic products such as cellular telephones with smaller form factors and/or that include additional functionality. Accordingly, there is a continuing demand for smaller and smaller electronic components used in these electronic products, for example, SAW resonators and filters that are incorporated in same. A method of decreasing the size of a SAW resonator while maintaining the operating frequency of the SAW resonator includes increasing the density of the IDT electrodes of the SAW resonator. Higher density IDT electrodes result in a reduced velocity and reduced wavelength of acoustic waves generated in the SAW resonator, which allows denser IDT electrodes to be spaced closer to each other than less dense IDT electrodes to achieve the same operating frequency. In many examples of previously and currently available SAW resonators, the IDT electrodes were formed of Mo, often with a layer of Al on top of the Mo to increase the conductivity of the IDT electrodes. To increase the density of the IDT electrodes, the Mo layer of the IDT electrodes may be replaced with a layer of a higher density material, for example, W.

Figure 3:
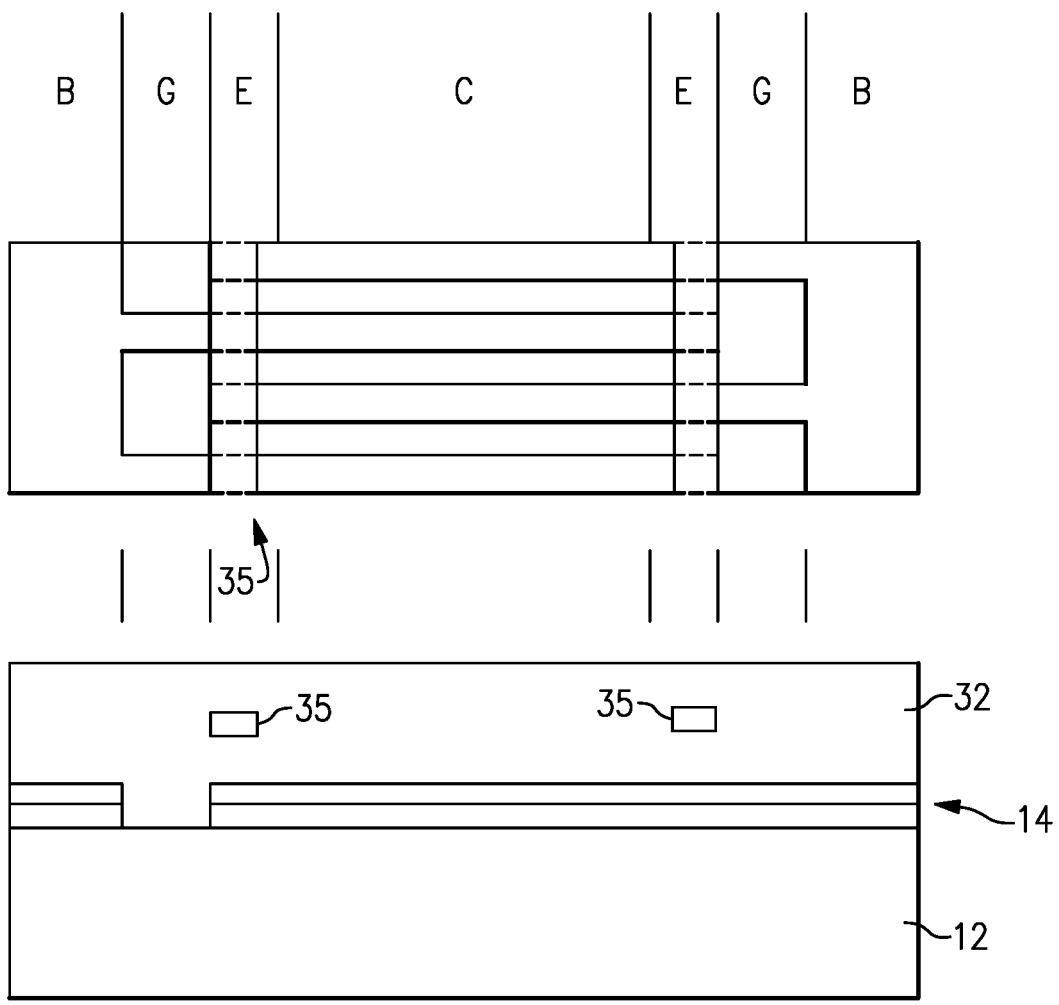
FIG. 3 illustrates an example of a surface acoustic wave resonator including high density strips of material in the dielectric material layer over tips of the interdigital transducer electrode fingers.
Figure 4A:
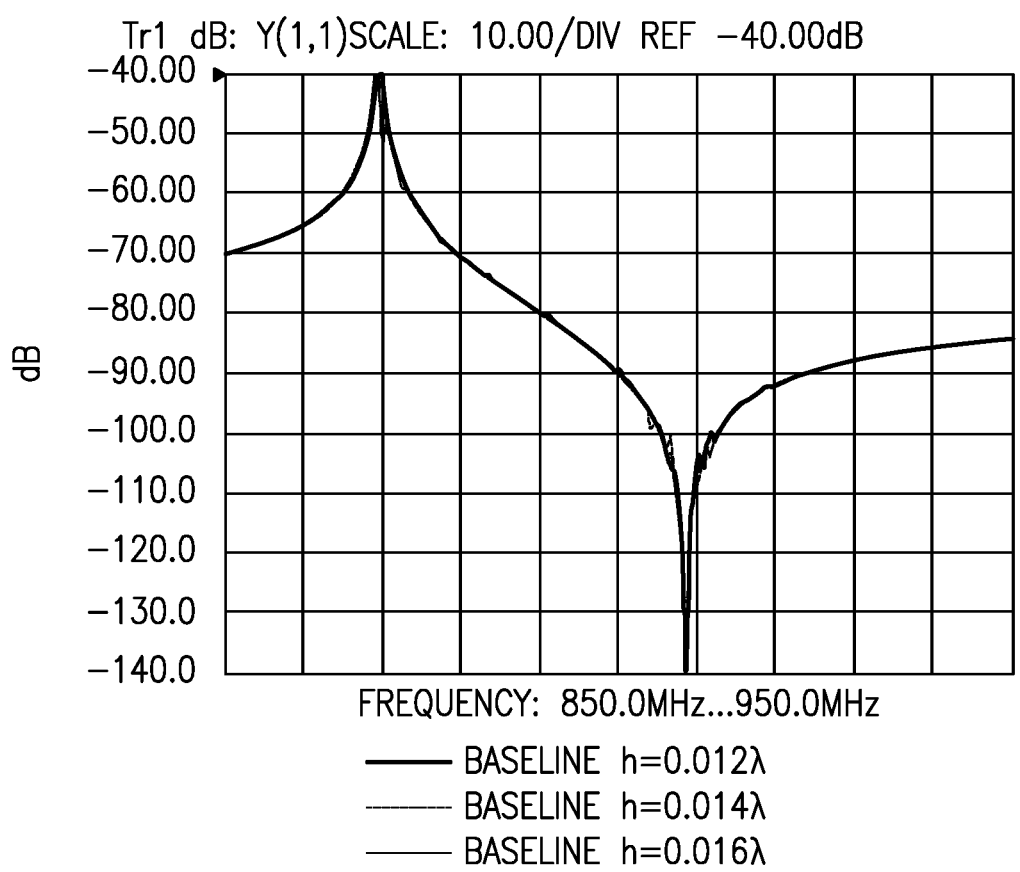
FIG. 4A illustrates results of a simulation of admittance versus frequency of the surface acoustic wave resonator of FIG. 3 with the high density strips of material disposed at different heights in the dielectric material layer.
Figure 4B:
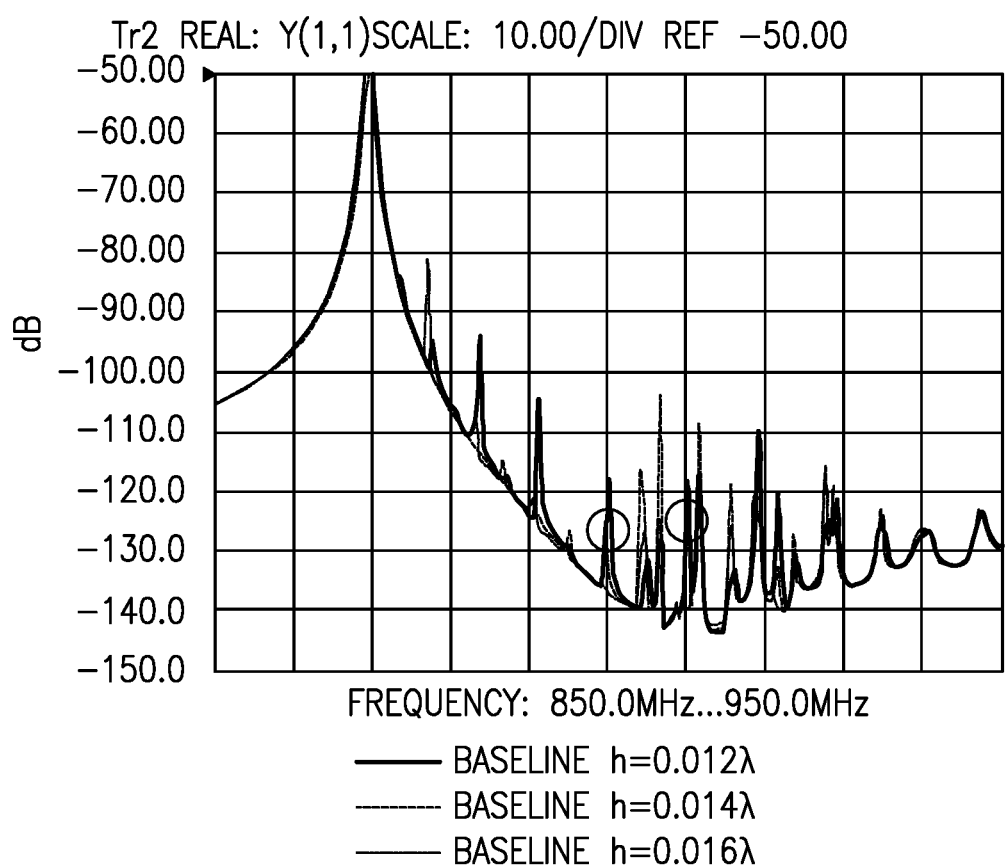
FIG. 4B illustrates results of a simulation of real admittance versus frequency of the surface acoustic wave resonator of FIG. 3 with the high density strips of material disposed at different heights in the dielectric material layer.
Figure 4C:
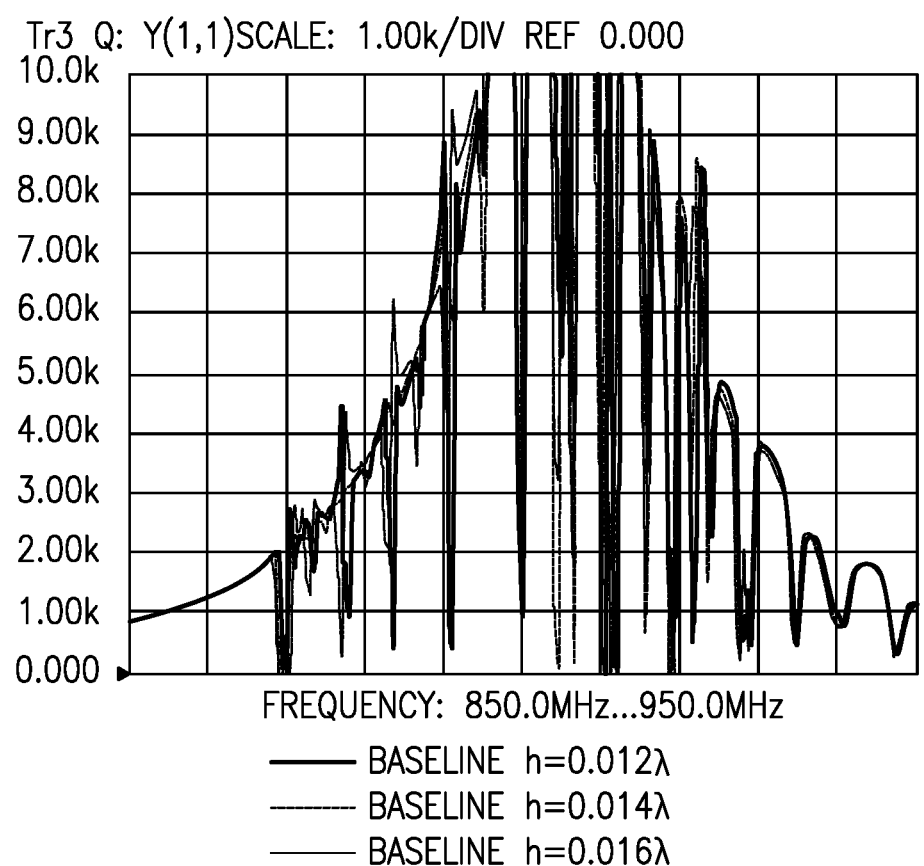
FIG. 4C illustrates results of a simulation of quality factor versus frequency of the surface acoustic wave resonator of FIG. 3 with the high density strips of material disposed at different heights in the dielectric material layer.

In some embodiments, illustrated in plan and cross-sectional views in FIG. 3, a strip 35 of a high density material may be placed within the layer of dielectric film 32 in the edge region of the electrode structure above tips of the electrode fingers 14. The high density material may be a metal, for example, Mo, W, Pt, Cu, or a dielectric material having a higher density than the density of the material of the dielectric film 32, for example, SiN, Al$_2$O$_3$ or another suitable dielectric material. The high density material causes a change in acoustic velocity through the SAW resonator in the vicinity of the tips of the electrode fingers, which helps reduce propagation of transverse wave spurious signals. In a simulation of the baseline case illustrated in FIG. 3 in which the main acoustic wave of the SAW resonator had a wavelength λ of 4 μm, the strips 35 were formed or molybdenum, had widths of 0.6λ, were disposed at the midpoint of thickness of the dielectric film 32 (which had a total thickness of 0.325λ), and had heights h of either 0.012 λ, 0.014λ, or 0.016λ, curves for admittance, real admittance, and quality factor Q illustrated in FIGS. 4A-4C, respectively, were obtained. The best suppression of transverse modes was observed for the simulation where the height h of the strips 35 was 0.014λ.

Figure 5:
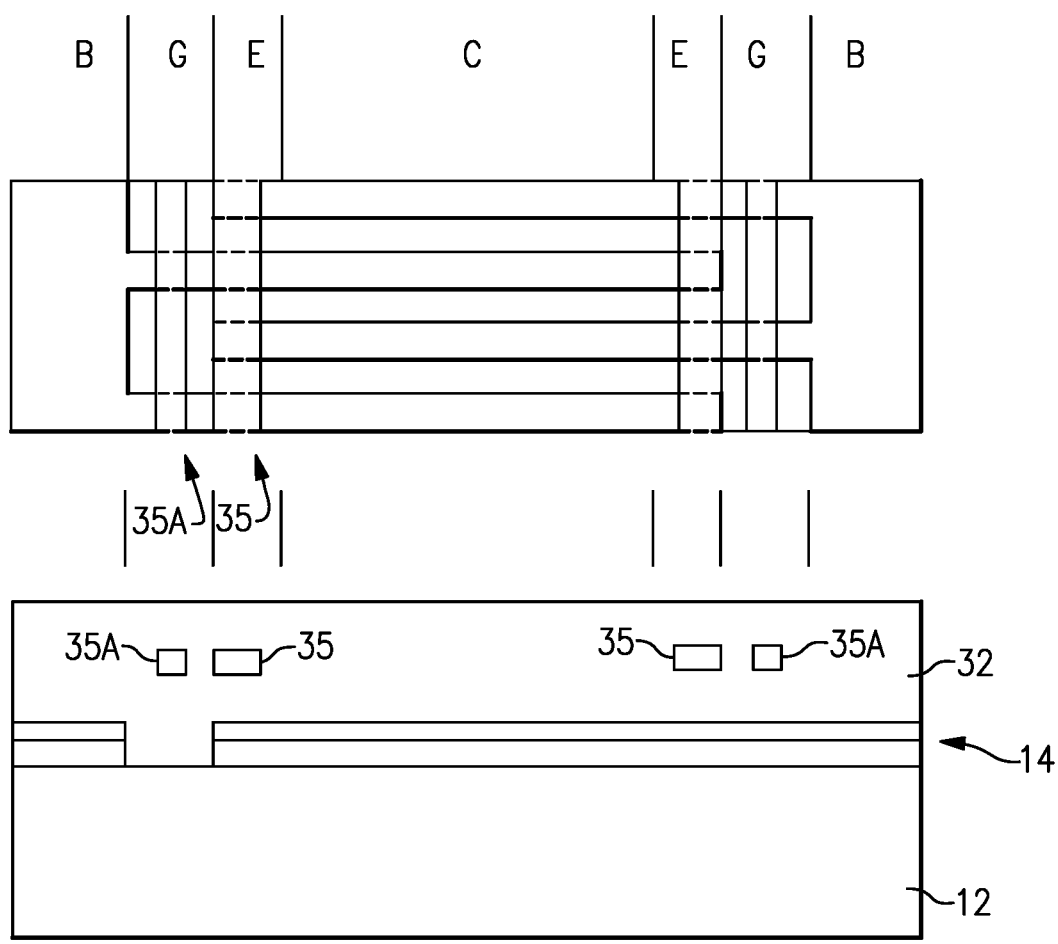
FIG. 5 illustrates an example of a surface acoustic wave resonator including high density strips of material in the dielectric material layer over tips of the interdigital transducer electrode fingers and in the gap regions of the electrode structure.

To further suppress transverse spurious modes, an additional high density material strip 35A may be added into the layer of dielectric film 32, for example, in the gap region of the electrode structure as illustrated in FIG. 5. High density material strip 35A may be narrower than high density material strip 35 as illustrated and may extend only partially over a portion of the gap region. The two high density material strips 35, 35A are illustrated in FIG. 5 as being at the same height within the layer of dielectric film 32 and having the same thickness, but in other embodiments, one of strips 35, 35A may be disposed higher or lower than the other in the layer of dielectric film 32 and may be thicker or thinner than the other one of the strips 35, 35A. In various embodiments either one or both of the high density material strips may have widths between 0.005λ and 0.030λ or between 0.010λ and 0.020λ. These width ranges may apply to any of the high density material strips in any of the embodiments disclosed herein.

Figure 6A:
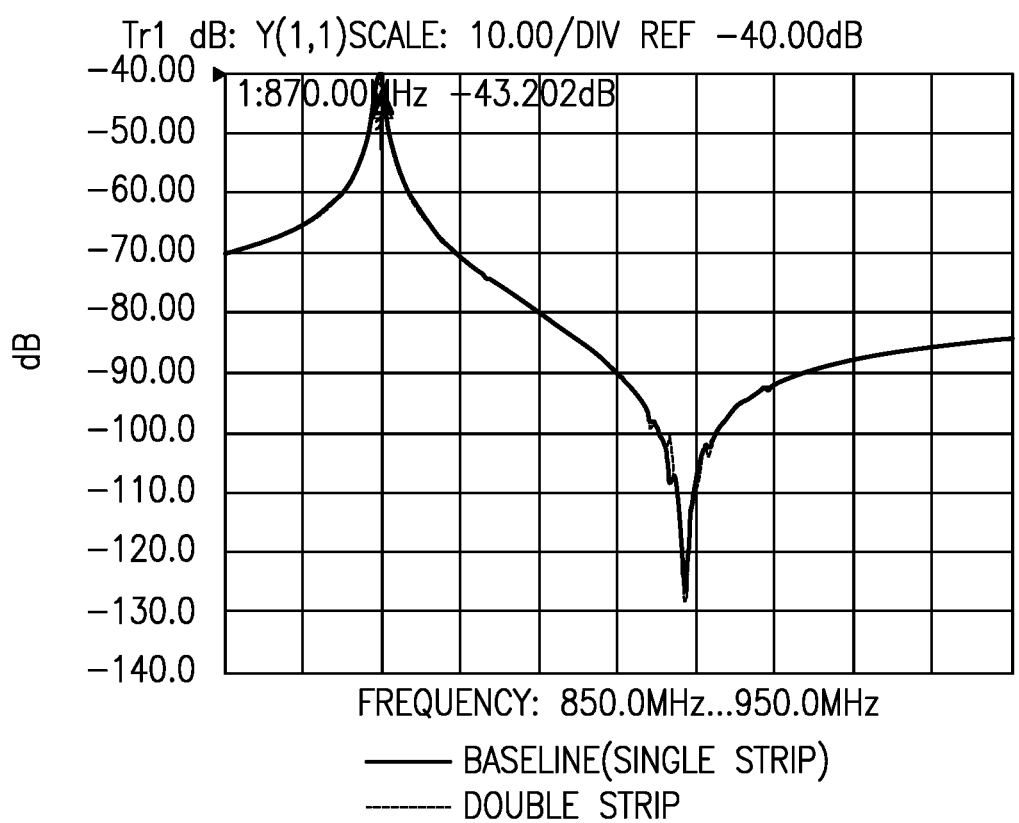
FIG. 6A illustrates results of a simulation of admittance versus frequency of the surface acoustic wave resonator of FIG. 3 versus the surface acoustic wave resonator of FIG. 5.
Figure 6B:
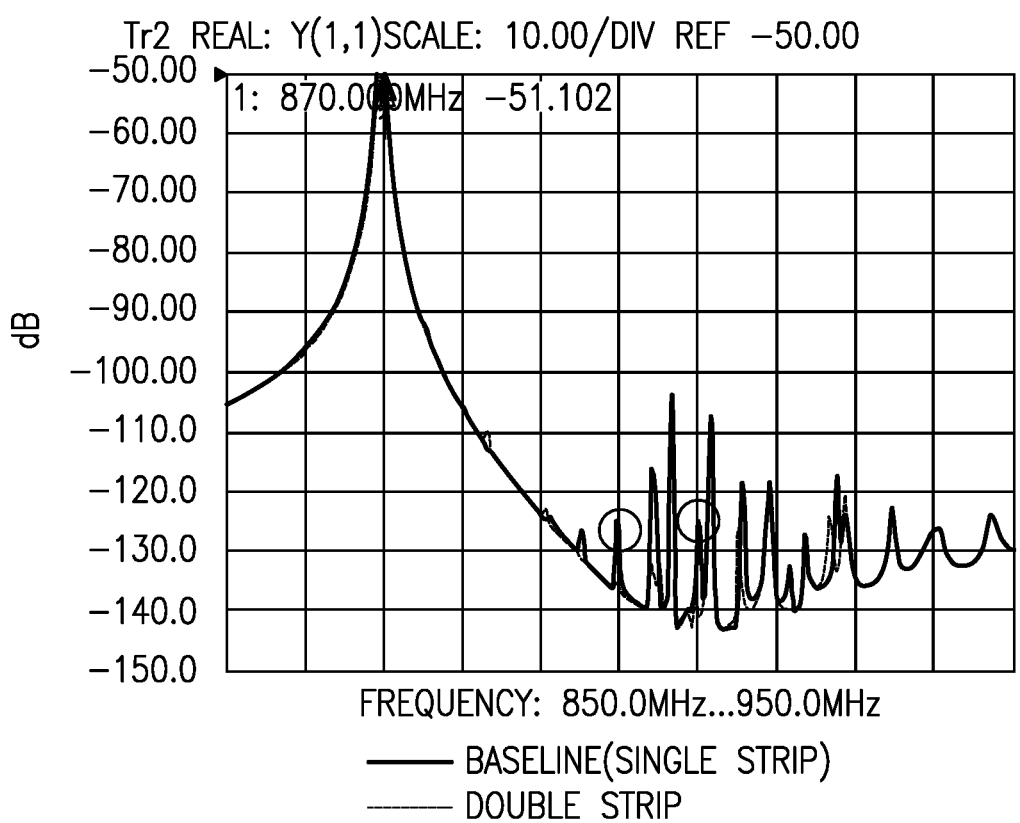
FIG. 6B illustrates results of a simulation of real admittance versus frequency of the surface acoustic wave resonator of FIG. 3 versus the surface acoustic wave resonator of FIG. 5.
Figure 6C:
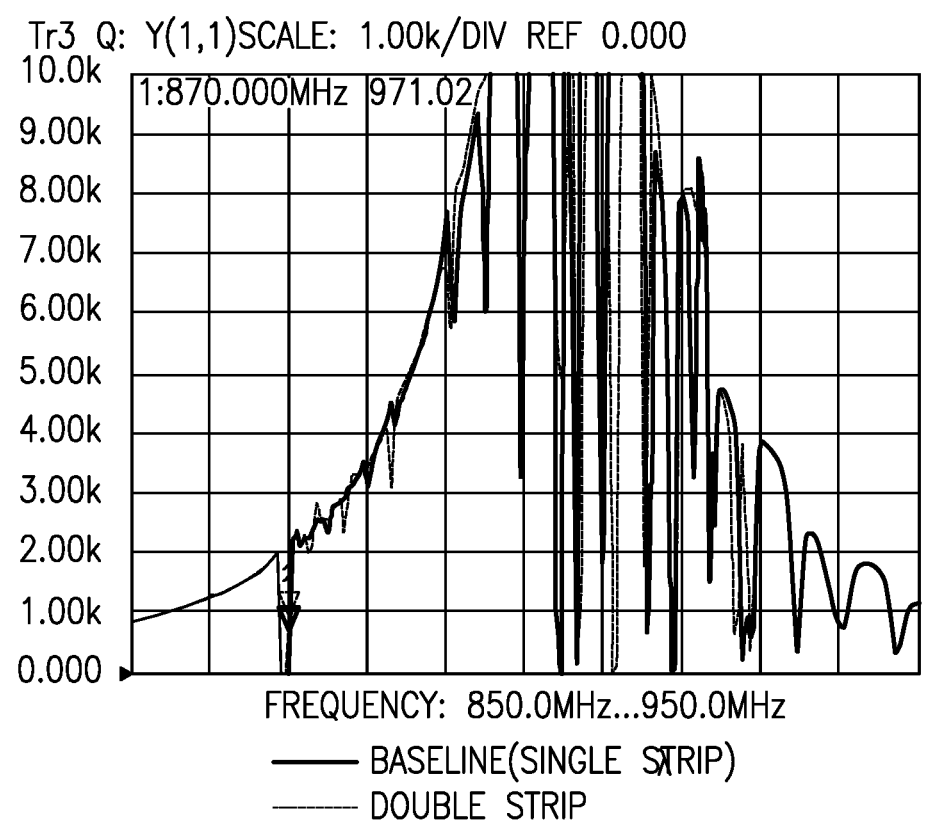
FIG. 6C illustrates results of a simulation of quality factor versus frequency of the surface acoustic wave resonator of FIG. 3 versus the surface acoustic wave resonator of FIG. 5.

A simulation was performed to determine admittance, real admittance, and quality factor Q versus frequency for a SAW resonator including pairs of strips 35, 35A as illustrated in FIG. 5 as compared with the baseline embodiment of FIG. 3. The strips 35A were simulated as having a width of 0.25λ and separated from the strips 35 by a lateral distance of 0.25λ. Both strips 35, 35A were simulated as having heights h of 0.014λ. All other parameters were the same as those used to generate the simulated results shown in FIGS. 4A-4C. The results of the comparative simulations of admittance, real admittance, and quality factor Q versus frequency are illustrated in FIGS. 6A-6C, respectively. The embodiment with two strips 35, 35A exhibited reduced spurious signal levels as compared to the baseline embodiment with a single strip, for example, at the circled points in the real admittance curve of FIG. 6B.

Figure 7A:
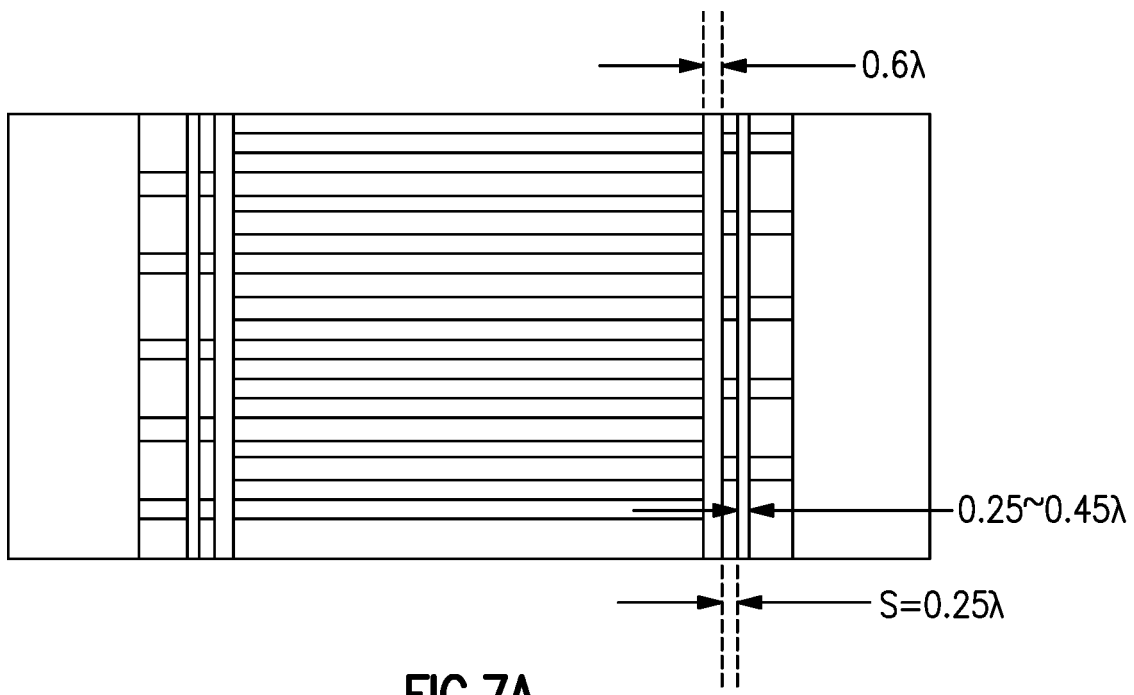
FIG. 7A illustrates the configuration of a surface acoustic wave resonator including high density strips of material in the dielectric material layer over tips of the interdigital transducer electrode fingers and in the gap regions of the electrode structure for which performance parameter were simulated for different values of width of the high density strips of material in the gap regions of the electrode structure.
Figure 7B:
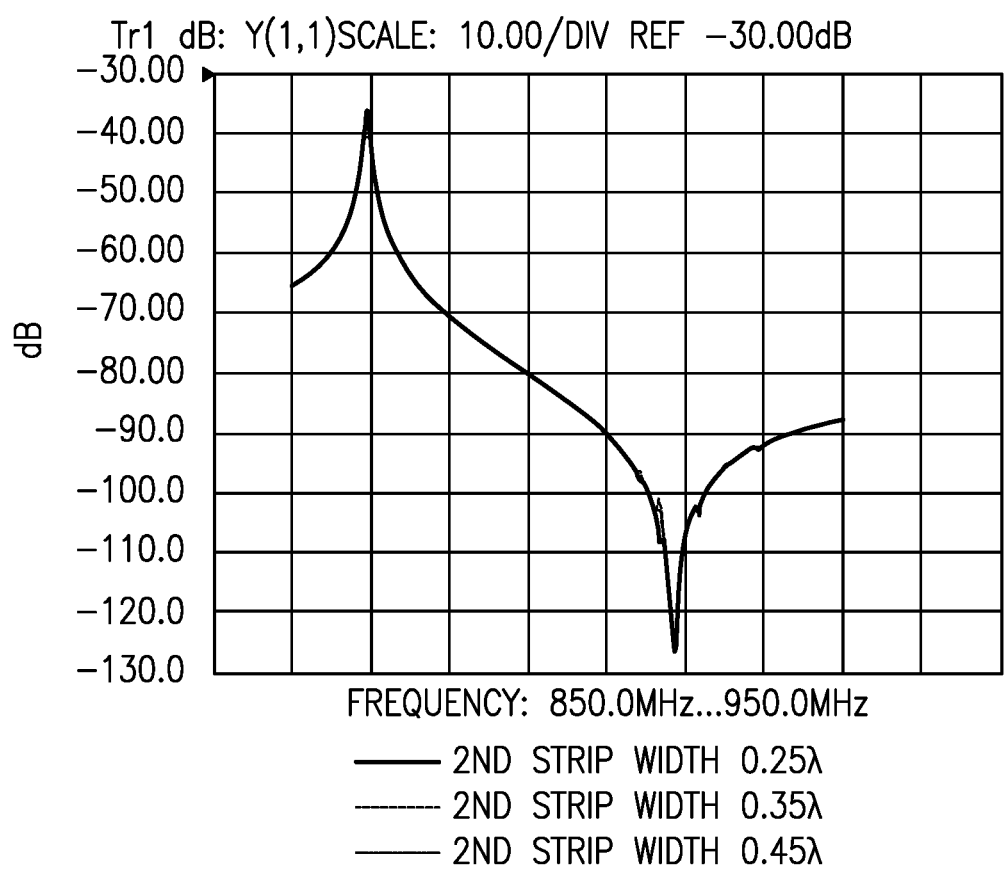
FIG. 7B illustrates results of a simulation of admittance versus frequency of the surface acoustic wave resonator of FIG. 7A for different values of width of the high density strips of material in the gap regions of the electrode structure.
Figure 7C:
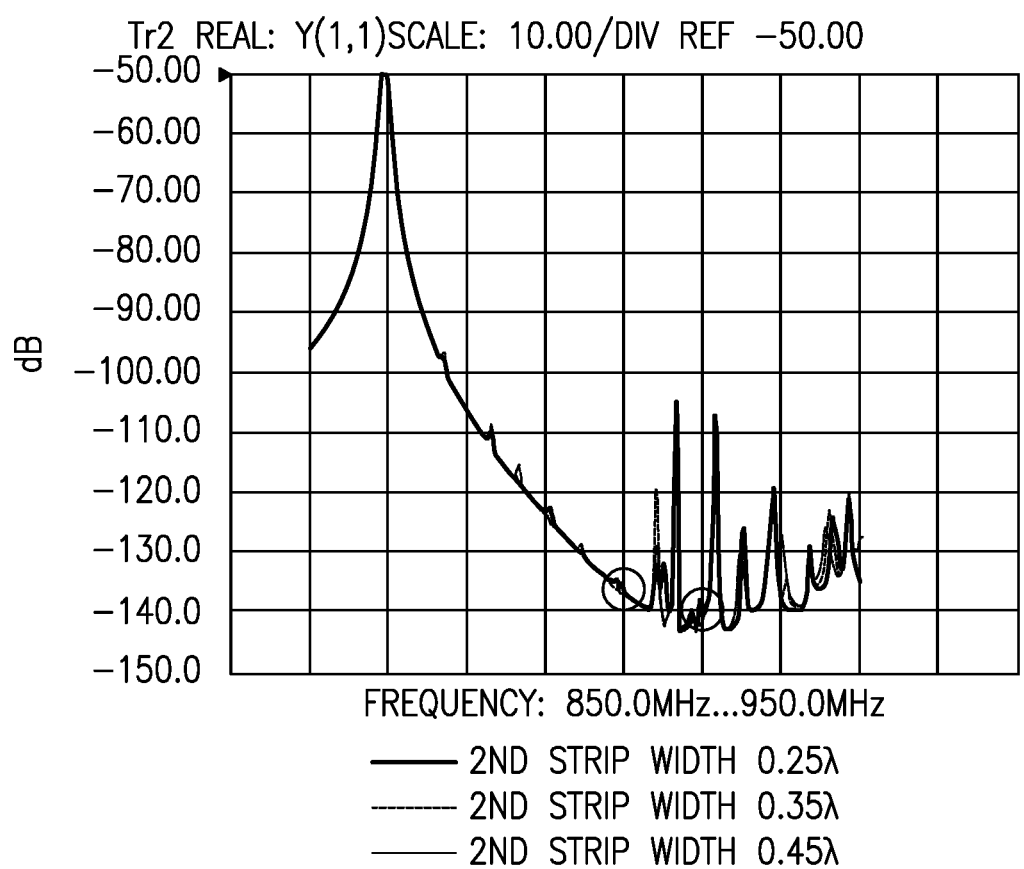
FIG. 7C illustrates results of a simulation of real admittance versus frequency of the surface acoustic wave resonator of FIG. 7A for different values of width of the high density strips of material in the gap regions of the electrode structure.
Figure 7D:
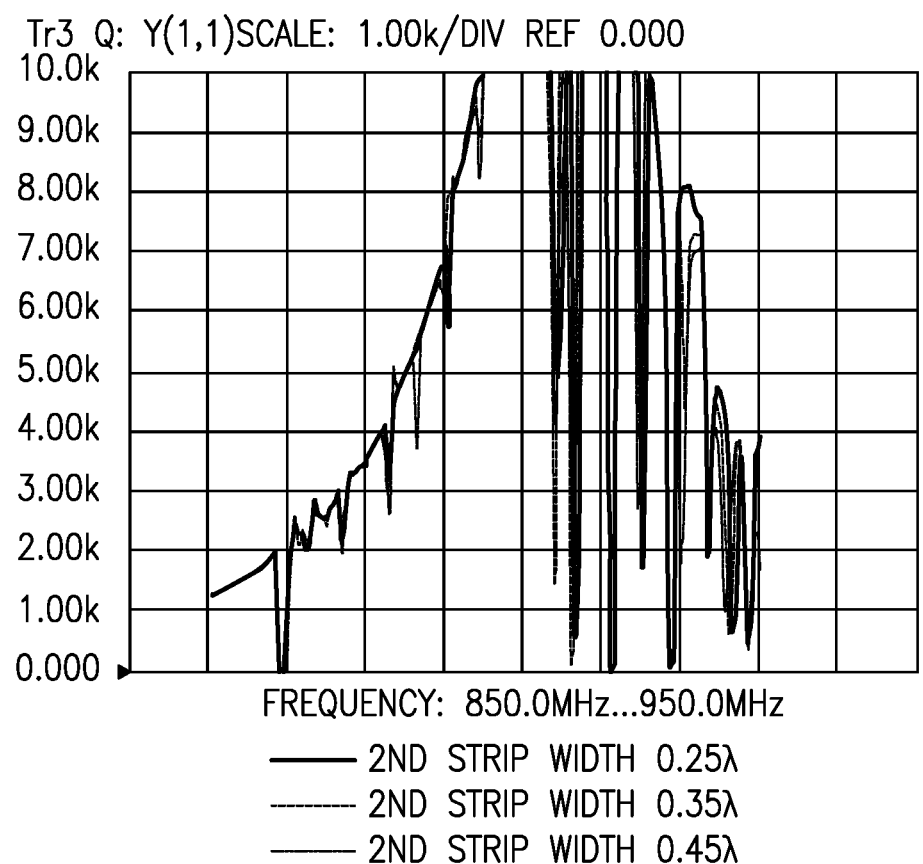
FIG. 7D illustrates results of a simulation of quality factor versus frequency of the surface acoustic wave resonator of FIG. 7A for different values of width of the high density strips of material in the gap regions of the electrode structure.

Simulations of admittance, real admittance, and quality factor Q versus frequency for a SAW resonator including pairs of strips 35, 35A as illustrated in FIG. 5 were performed where the strip 35 had a width of 0.6λ, the strips had heights of 0.014λ, and the strips 35, 35A were separated by a distance of 0.25λ. The width of the second strip 35A was varied between 0.25λ and 0.45λ as illustrated in FIG. 7A. The results of the simulations illustrating the effect of second strip width on admittance, real admittance, and quality factor Q versus frequency of the simulated SAW resonator are shown in FIGS. 7B-7D, respectively. The case where the width of the second strip was 0.25λ exhibited the best suppression of spurious transverse mode signals as illustrated in the real admittance curve of FIG. 7C.

Figure 8A:
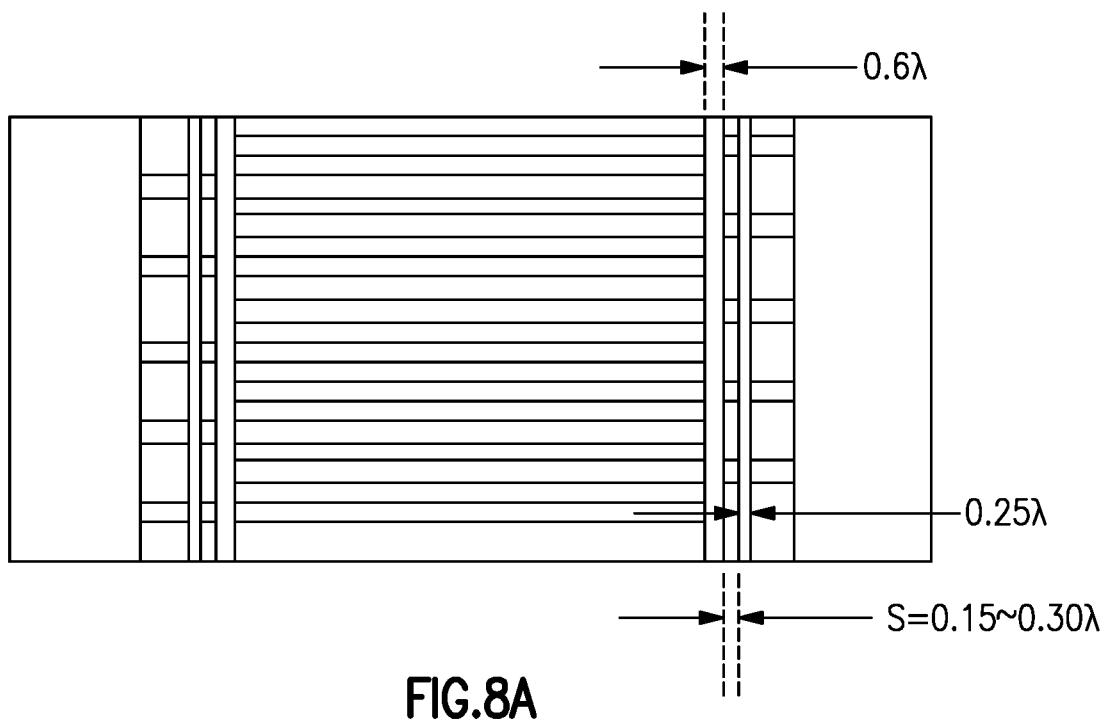
FIG. 8A illustrates the configuration of a surface acoustic wave resonator including high density strips of material in the dielectric material layer over tips of the interdigital transducer electrode fingers and in the gap regions of the electrode structure for which performance parameter were simulated for different values of separation distance between the high density strips of material.
Figure 8B:
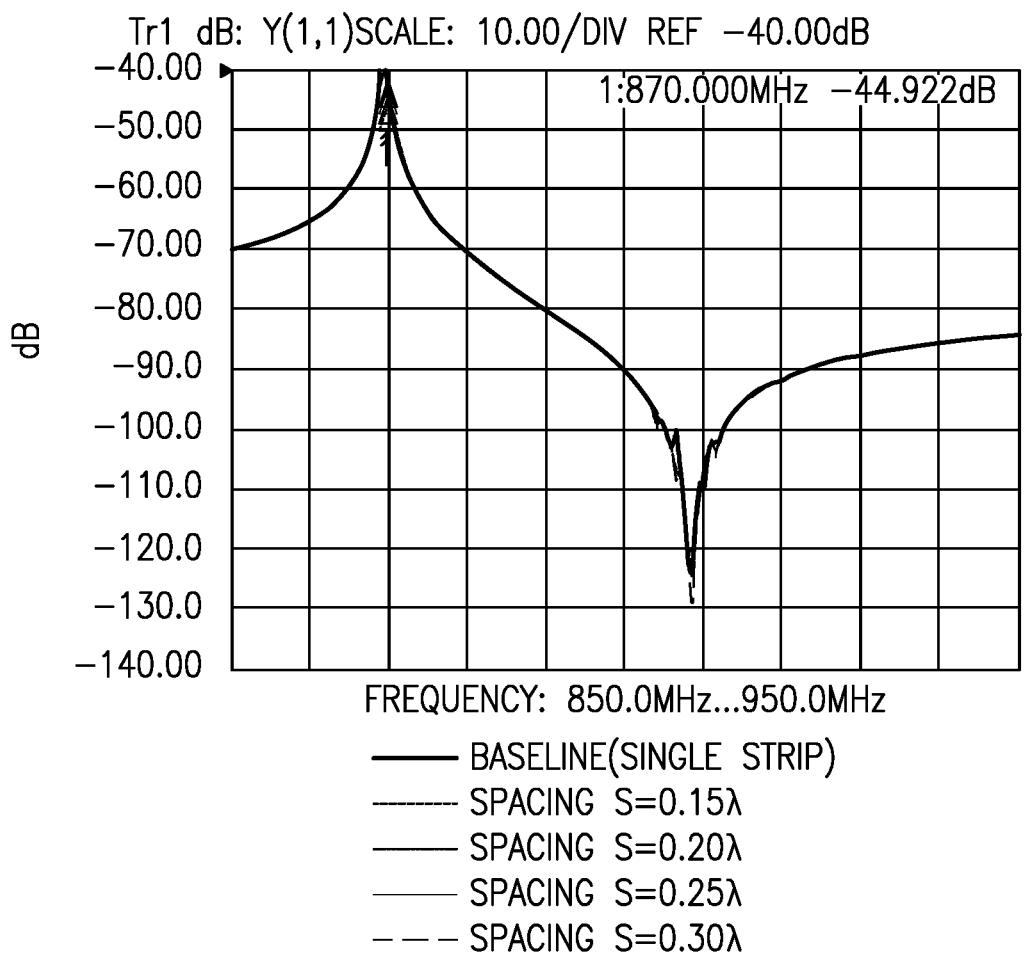
FIG. 8B illustrates results of a simulation of admittance versus frequency of the surface acoustic wave resonator of FIG. 8A for different values of separation distance between the high density strips of material.
Figure 8C:
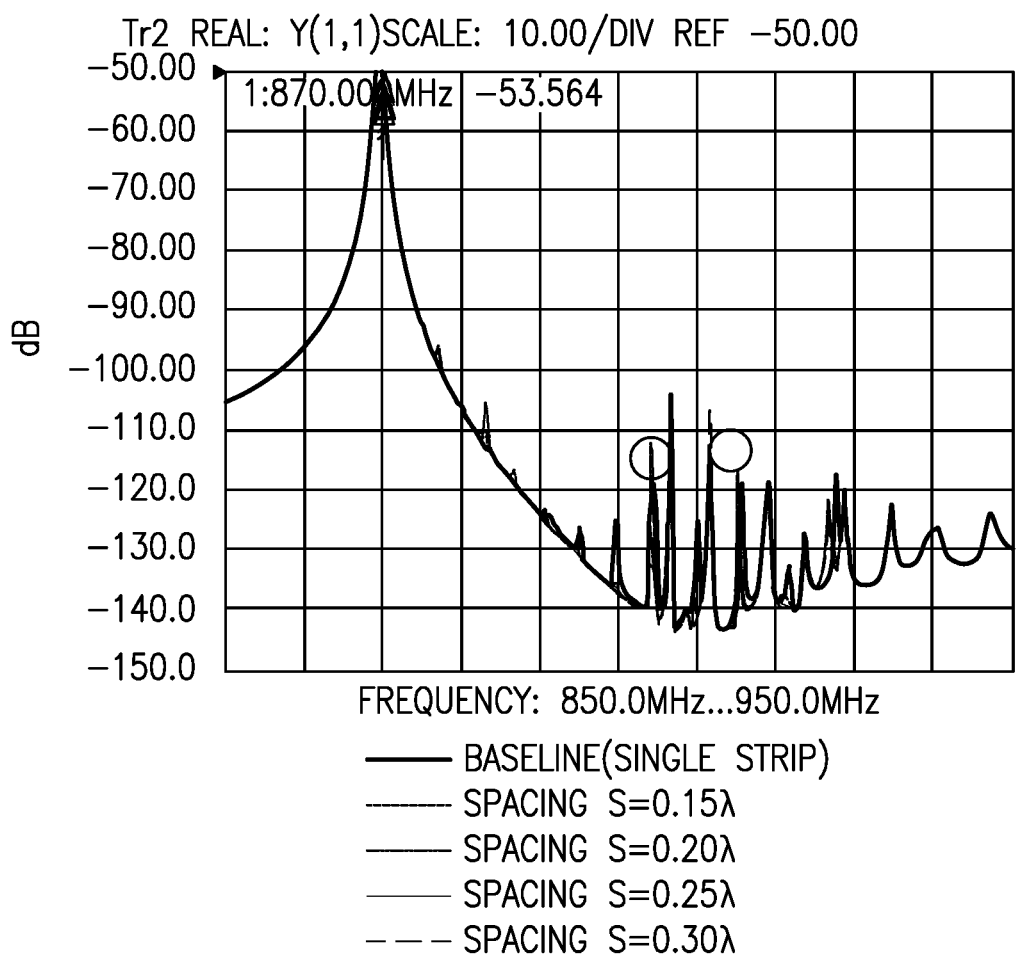
FIG. 8C illustrates results of a simulation of real admittance versus frequency of the surface acoustic wave resonator of FIG. 8A for different values of separation distance between the high density strips of material.
Figure 8D:
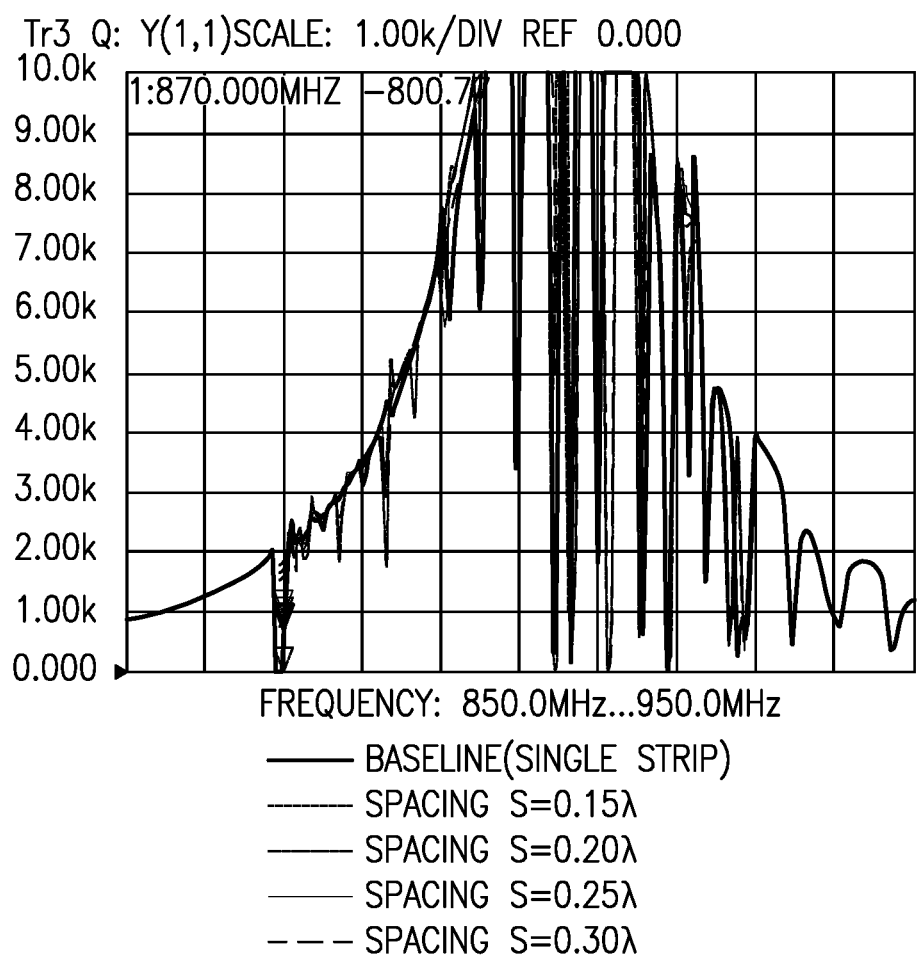
FIG. 8D illustrates results of a simulation of quality factor versus frequency of the surface acoustic wave resonator of FIG. 8A for different values of separation distance between the high density strips of material.

Simulations of admittance, real admittance, and quality factor Q versus frequency for a SAW resonator including pairs of strips 35, 35A as illustrated in FIG. 5 were performed where the strip 35 had a width of 0.6λ, the strip 35A had a width of 0.25λ, and the strips had heights of 0.014λ. The separation distance between the strips 35, 35A was varied between 0.15λ and 0.30λ as illustrated in FIG. 8A. The results of the simulations illustrating the effect of high density material strip separation on admittance, real admittance, and quality factor Q versus frequency of the simulated SAW resonator are shown in FIGS. 8B-8D, respectively. The case where the separation between strips 35, 35A was 0.25λ exhibited the best suppression of spurious transverse mode signals as illustrated in the real admittance curve of FIG. 8C.

Figure 9A:
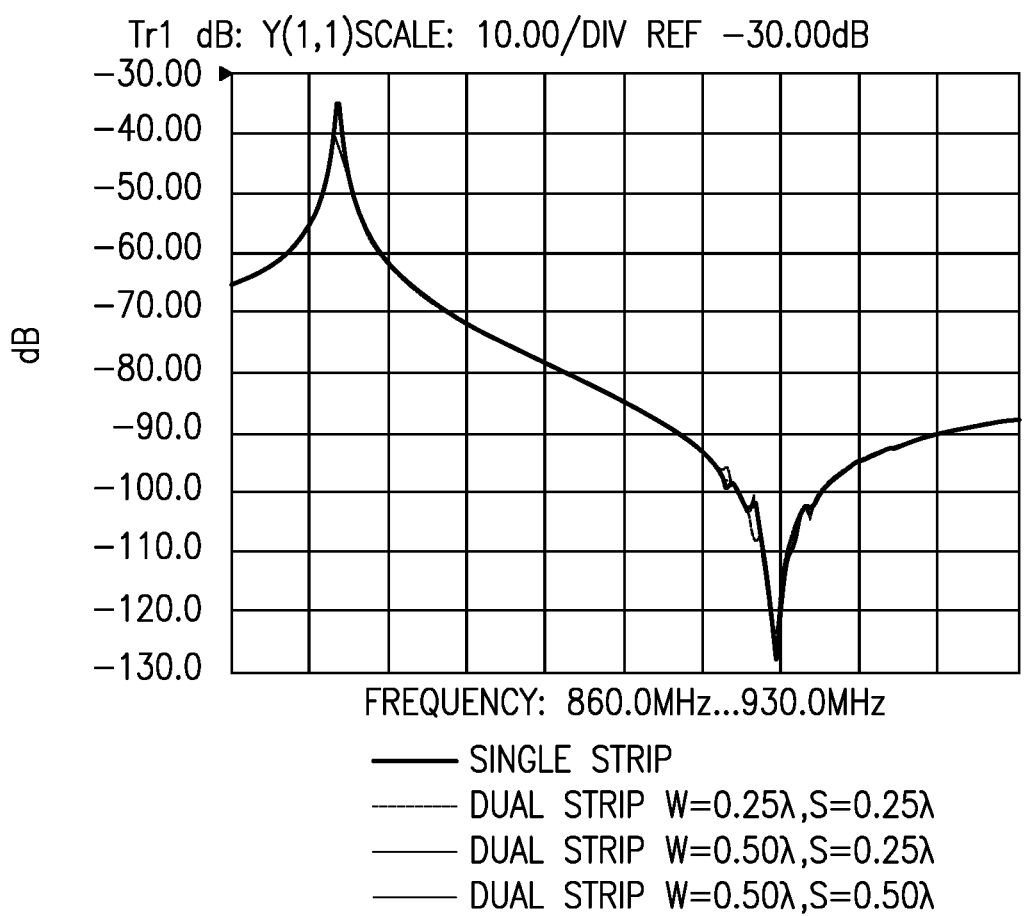
FIG. 9A illustrates results of a simulation of admittance versus frequency of the surface acoustic wave resonator of FIG. 5 for different values of separation distance between the high density strips of material and for different widths of the high density strips of material in the gap regions of the electrode structure.
Figure 9B:
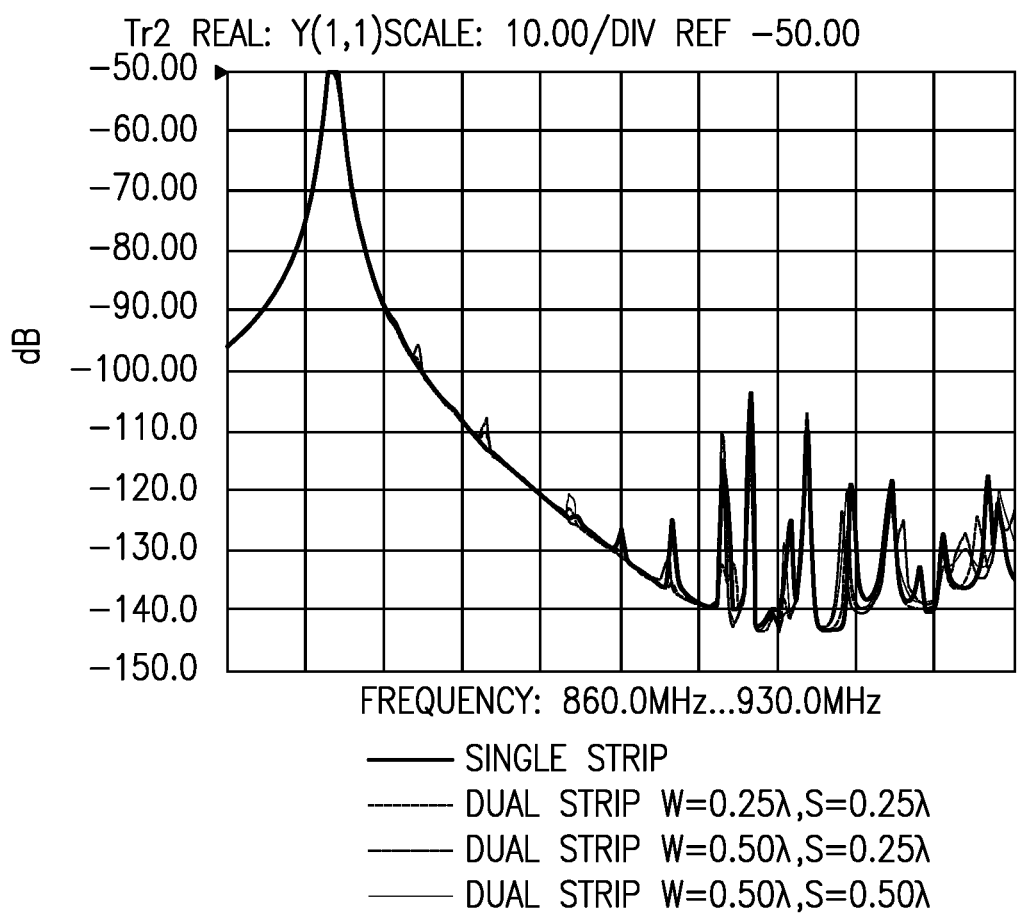
FIG. 9B illustrates results of a simulation of real admittance versus frequency of the surface acoustic wave resonator of FIG. 5 for different values of separation distance between the high density strips of material and for different widths of the high density strips of material in the gap regions of the electrode structure.
Figure 9C:
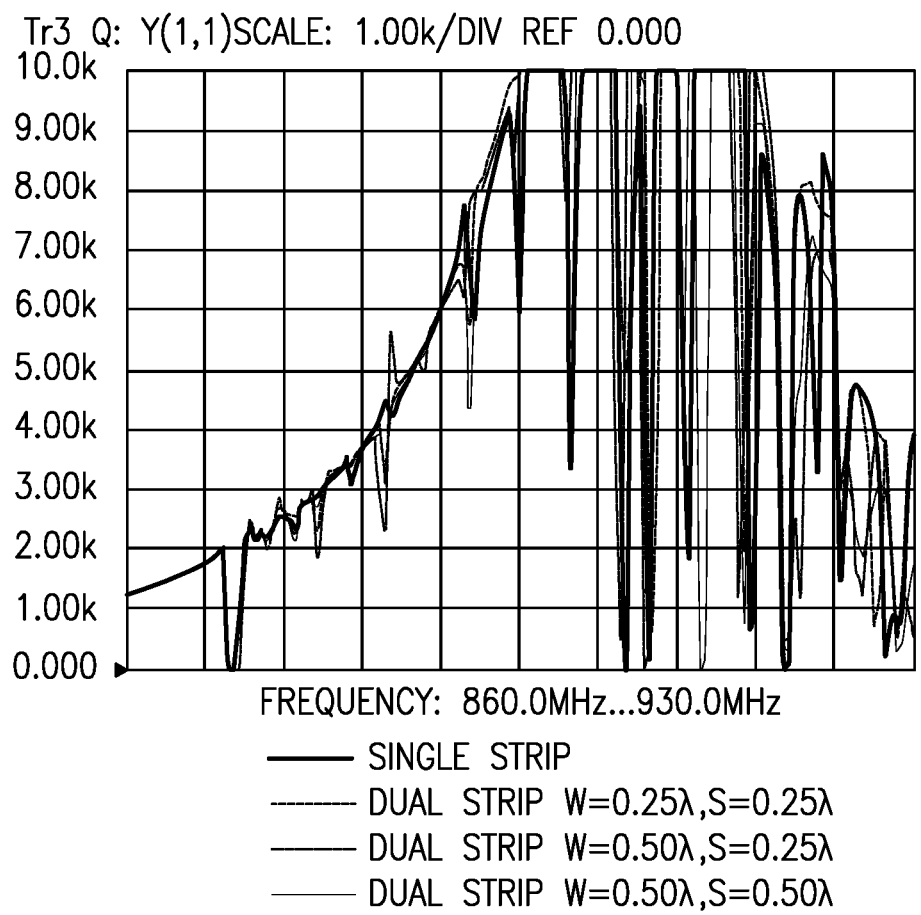
FIG. 9C illustrates results of a simulation of quality factor versus frequency of the surface acoustic wave resonator of FIG.

Simulations of admittance, real admittance, and quality factor Q versus frequency for a SAW resonator including pairs of high density material strips 35, 35A as illustrated in FIG. 5 were performed in which both the spacing between the strips and the width of the outer strips 35A were varied. The inner strips 35 were simulated as having widths of 0.6λ. The strips were simulated as being spaced apart by either s=0.25λ or s=0.50λ and the outer strips 35A were simulated as having widths of either w=0.25λ or w=0.50λ. The results of these simulations are illustrated in FIGS. 9A-9C. Also shown for comparison are results of simulations of the different parameters for a SAW resonator having a single high density strip within the layer of dielectric material 32 over the tips of the electrode fingers in the edge regions of the electrode structure as illustrated in FIG. 3. The case where strips 35, 35A were separated by 0.25λ and the outer strips hade widths of 0.25λ showed the best suppression of transverse spurious signals.

Figure 10:
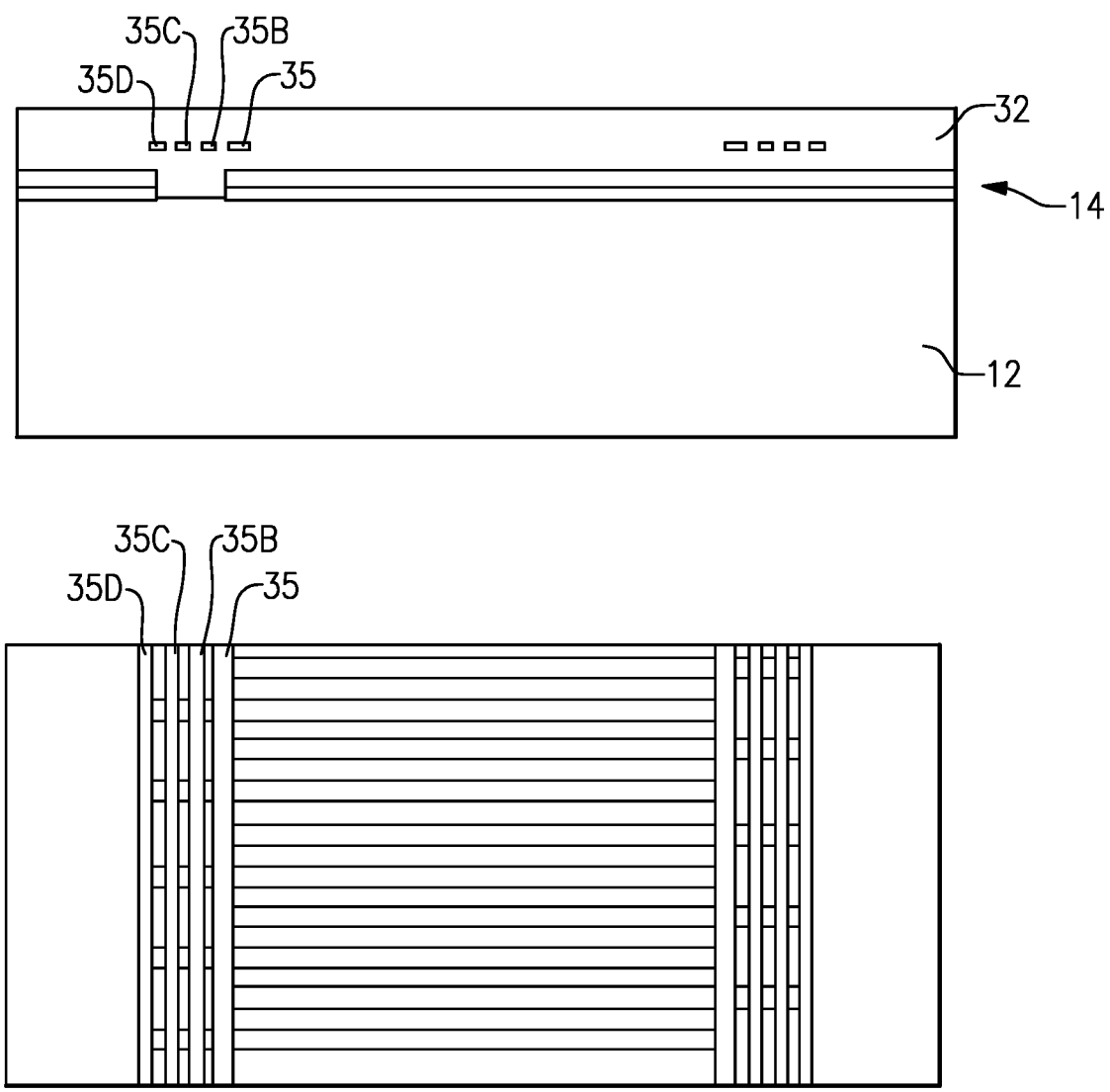
FIG. 10 illustrates an example of a surface acoustic wave resonator including high density strips of material in the dielectric material layer over tips of the interdigital transducer electrode fingers and three strips of high density material in the gap regions of the electrode structure.

In other embodiments, a SAW resonator may include more than two high density material strips. For example, FIG. 10 illustrates a cross-sectional and a plan view of a SAW resonator structure including four high density material strips 35, 35B, 35C, 35D disposed in the layer of dielectric material 32. One of the high density material strips 35 may be disposed over the tips of the electrode fingers in the edge regions of the electrode structure and the other three strips 35B, 35C, 35D may be disposed within the gap region. The high density material strips 35B, 35C, 35D disposed within the gap region may have lesser widths than the high density material strip 35 disposed in the edge region. Each of the high density material strips 35B, 35C, 35D disposed within the gap region may have a similar or same width. Any of the high density material strips 35, 35B, 35C, 35D may have widths between 0.005λ and 0.030λ or between 0.010λ and 0.020λ. One of the high density material strips 35D disposed in the gap region may have an outside edge disposed at the boundary between the gap region and bus bar region of the IDT electrodes.

Figure 11:
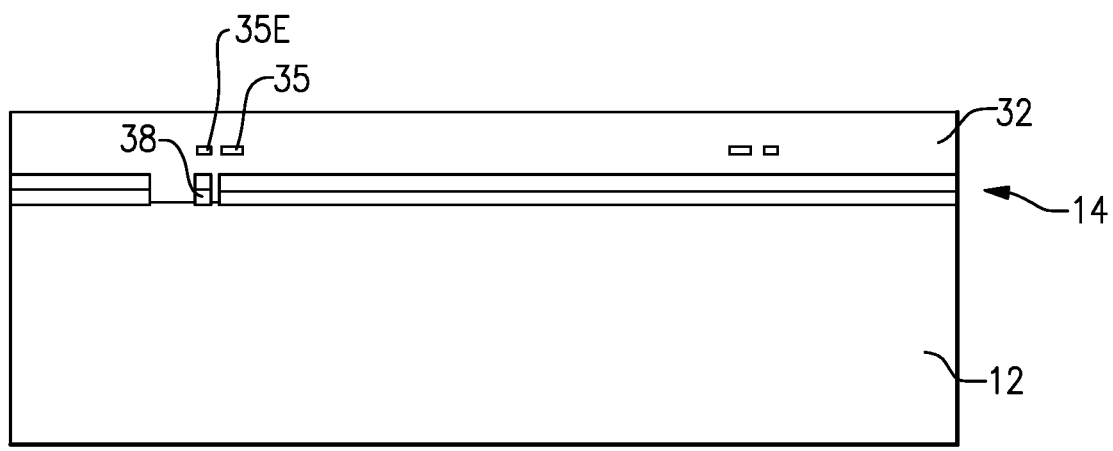
FIG. 11 illustrates an example of a surface acoustic wave resonator including a mini-bus bar and high density strips of material in the dielectric material layer over tips of the interdigital transducer electrode fingers and over the mini-bus bar.
Figure 11:
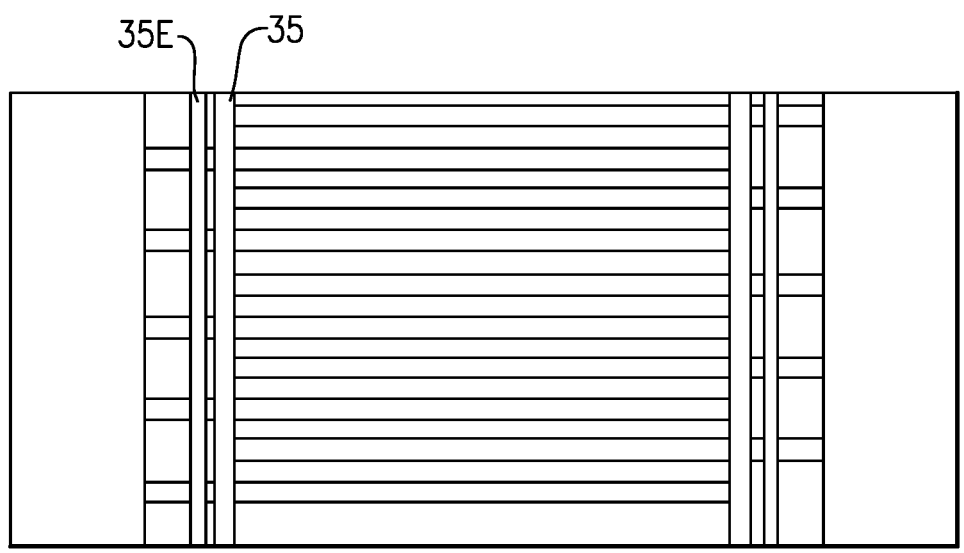

In embodiments of SAW resonators including a mini-bus bar 38, one high density material strip 35 may be disposed in the layer of dielectric material 32 over the tips of the electrode fingers in the edge regions of the electrode structure, while a second high density material strip 35E may be disposed in the layer of dielectric material 32 over the mini-bus bar 38 as illustrated in cross-sectional and plan view in FIG. 11. In some embodiments, both the high density material strips 35, 35E are disposed at the same height in the layer of dielectric material 32 while in other embodiments, the high density material strips 35, 35E are disposed at different heights in the layer of dielectric material 32. The high density material strips 35, 35E may have the same dimensions or different dimensions. For example, as illustrated in FIG. 11, the high density material strip 35E disposed over the mini-bus bar 38 may have a lesser width than the high density material strip 35 disposed over the tips of the electrode fingers in the edge regions of the electrode structure. The high density material strips 35, 35E may have the same thickness as illustrated in FIG. 11, or one of the high density material strips 35, 35E may be thicker or thinner than the other.

Figure 12A:
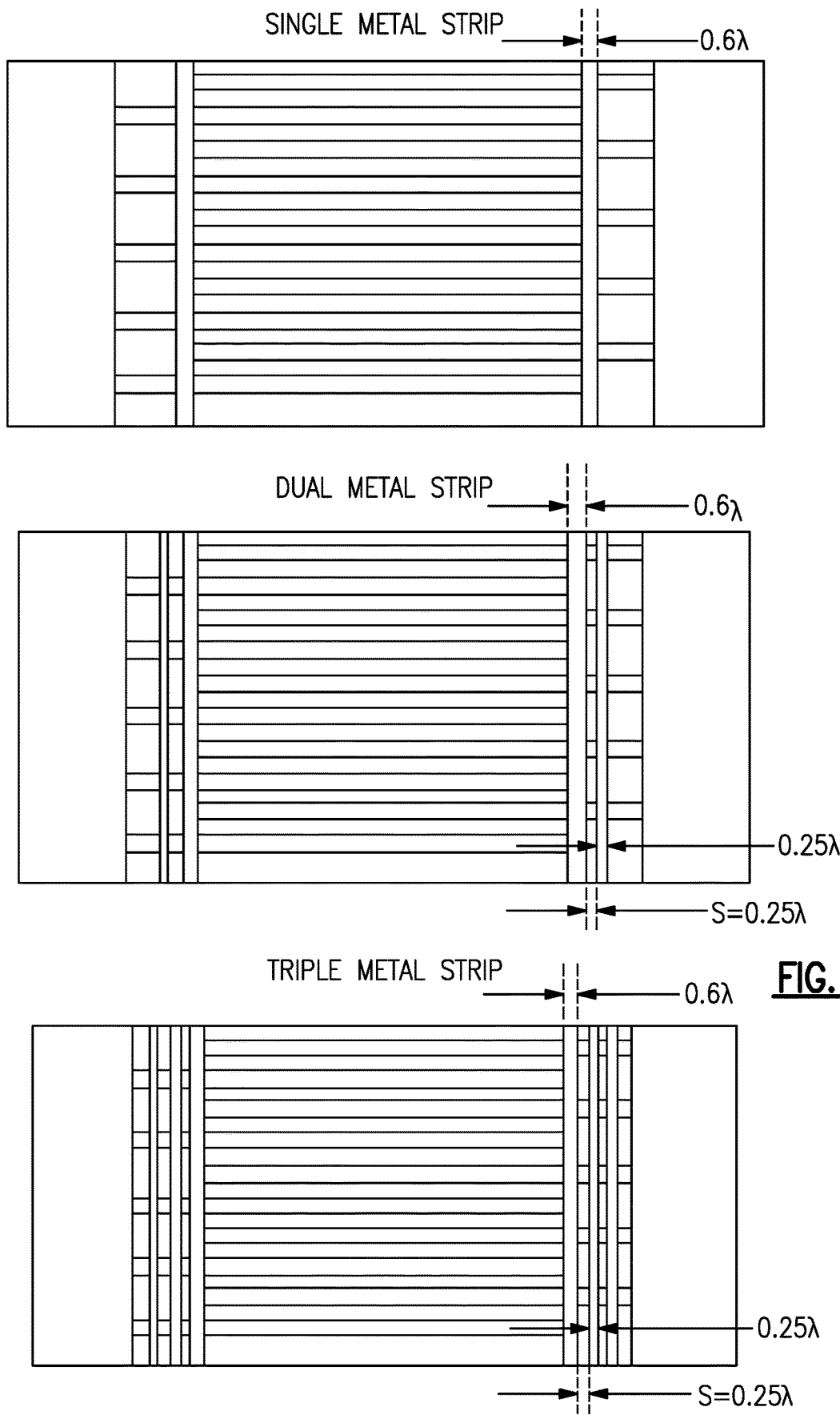
FIG. 12A illustrates examples of surface acoustic wave resonators including different numbers of Mo strips in the gap regions of the electrode structure.
Figure 12B:
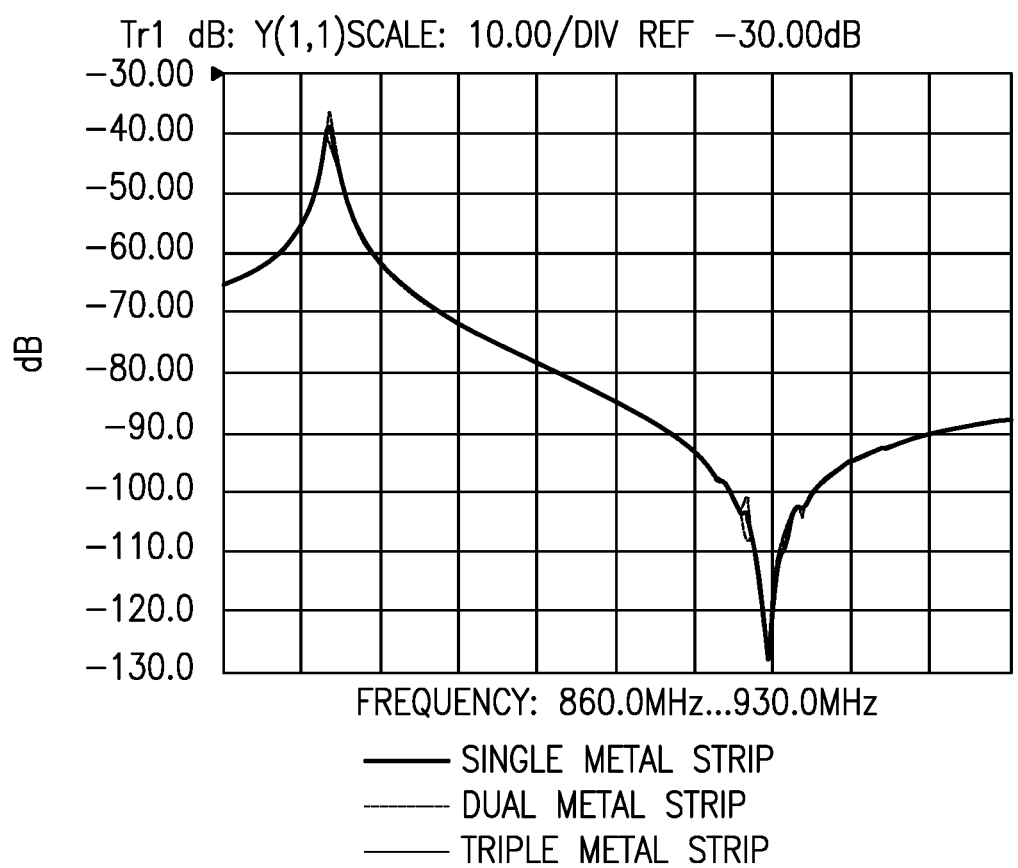
FIG. 12B illustrates results of a simulation of admittance versus frequency for the different surface acoustic wave resonators of FIG. 12A.
Figure 12C:
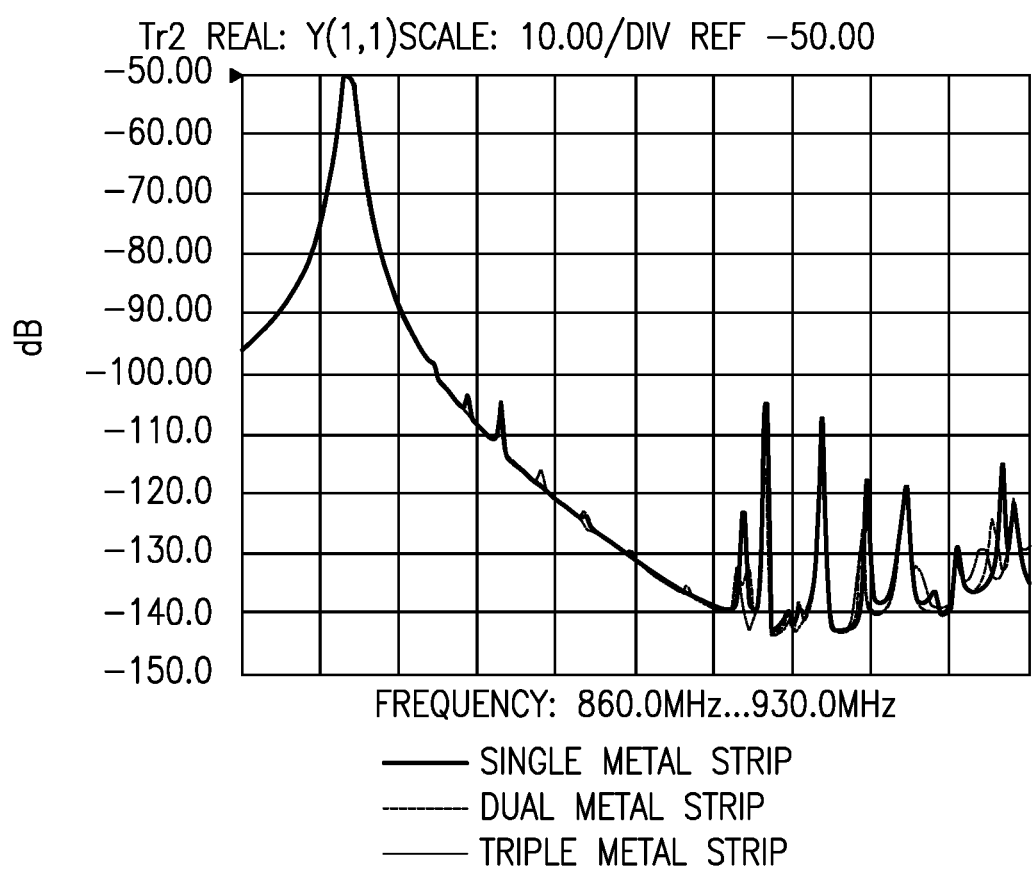
FIG. 12C illustrates results of a simulation of real admittance versus frequency for the different surface acoustic wave resonators of FIG. 12A.
Figure 12D:
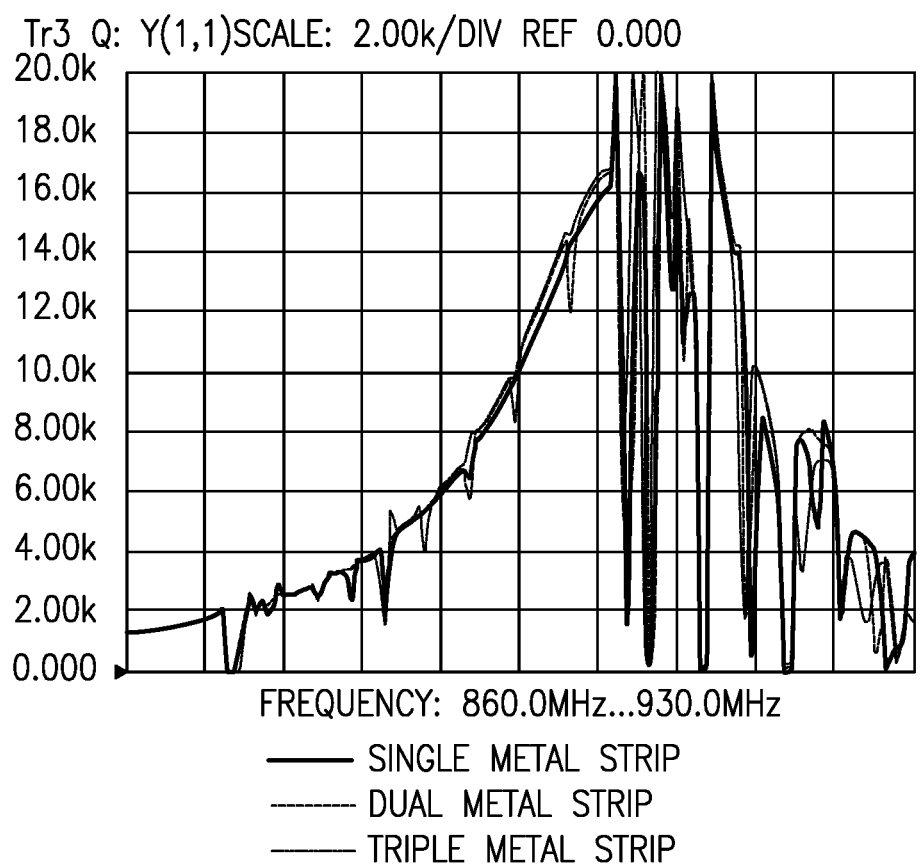
FIG. 12D illustrates results of a simulation of quality factor versus frequency for the different surface acoustic wave resonators of FIG. 12A.

Simulations were performed to determine how the addition of high density material strips in the layer of dielectric material within the gap region of a SAW resonator impacted admittance, real admittance, and quality factor Q versus frequency for the SAW resonator. Simulations were performed comparing these parameters for a SAW resonator having a single high density material strip within the layer of dielectric material 32 over the tips of the electrode fingers in the edge regions of the electrode structure as illustrated in FIG. 3 (the "single metal strip" case), for a SAW resonator additionally including one high density material strip within the layer of dielectric material 32 in the gap region (the "dual metal strip" case), and for a SAW resonator additionally including two high density material strips within the layer of dielectric material 32 in the gap region (the "triple metal strip" case.) All metal strips were simulated as formed of Mo. All strips were simulated as having heights of 0.014λ in a layer of dielectric material 32 having a total height (thickness) of 0.325λ. The high density material strip within the layer of dielectric material 32 over the tips of the electrode fingers in the edge regions of the electrode structure was simulated as having a width of 0.6λ and the high density material strip within the gap regions were simulated as having widths of 0.25λ. All high density material strips were simulated as spaced 0.25λ apart from one another. The simulated resonators are illustrated schematically in FIG. 12A. The results of the simulations for admittance, real admittance, and quality factor Q versus frequency for the simulated SAW resonators are illustrated in FIGS. 12B-12D, respectively. Both the dual and triple metal strip embodiments suppressed spurious transverse signals better than the single metal strip embodiment, with the dual and triple metal strip embodiments exhibiting similar performance.

Figure 13A:
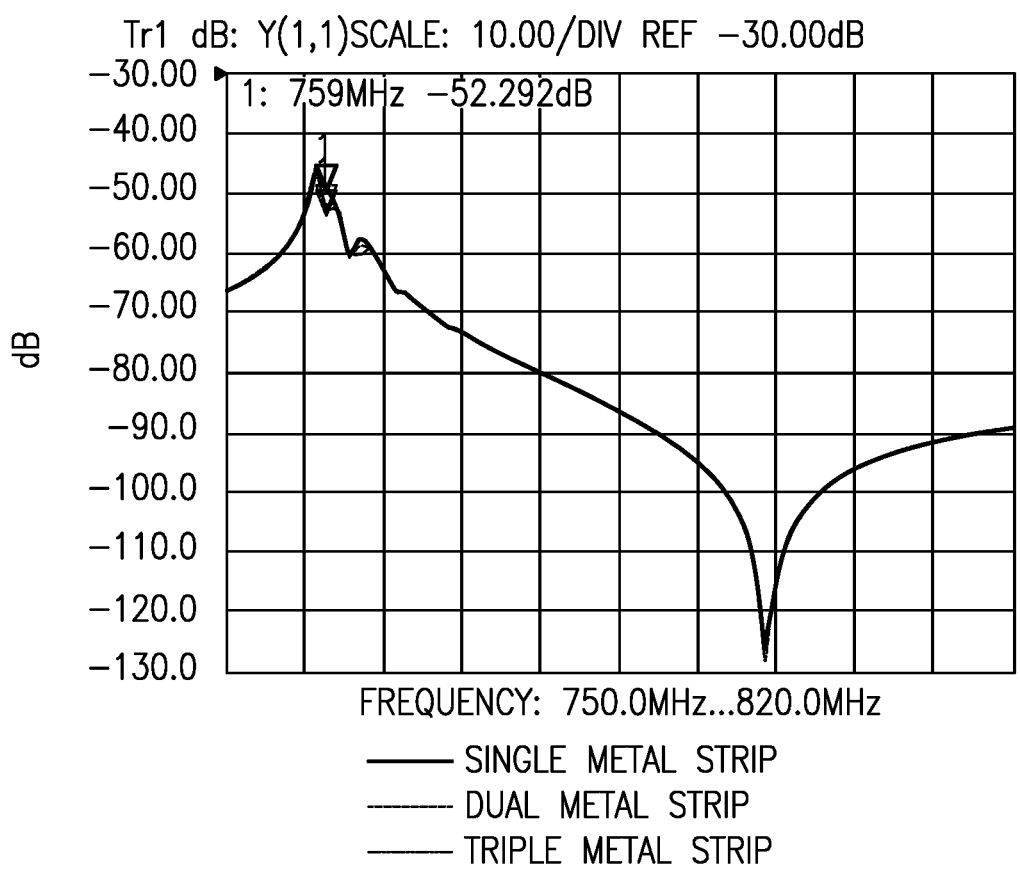
FIG. 13A illustrates results of a simulation of admittance versus frequency for the different surface acoustic wave resonators of FIG. 12A but with the Mo strips replaced by W strips.
Figure 13B:
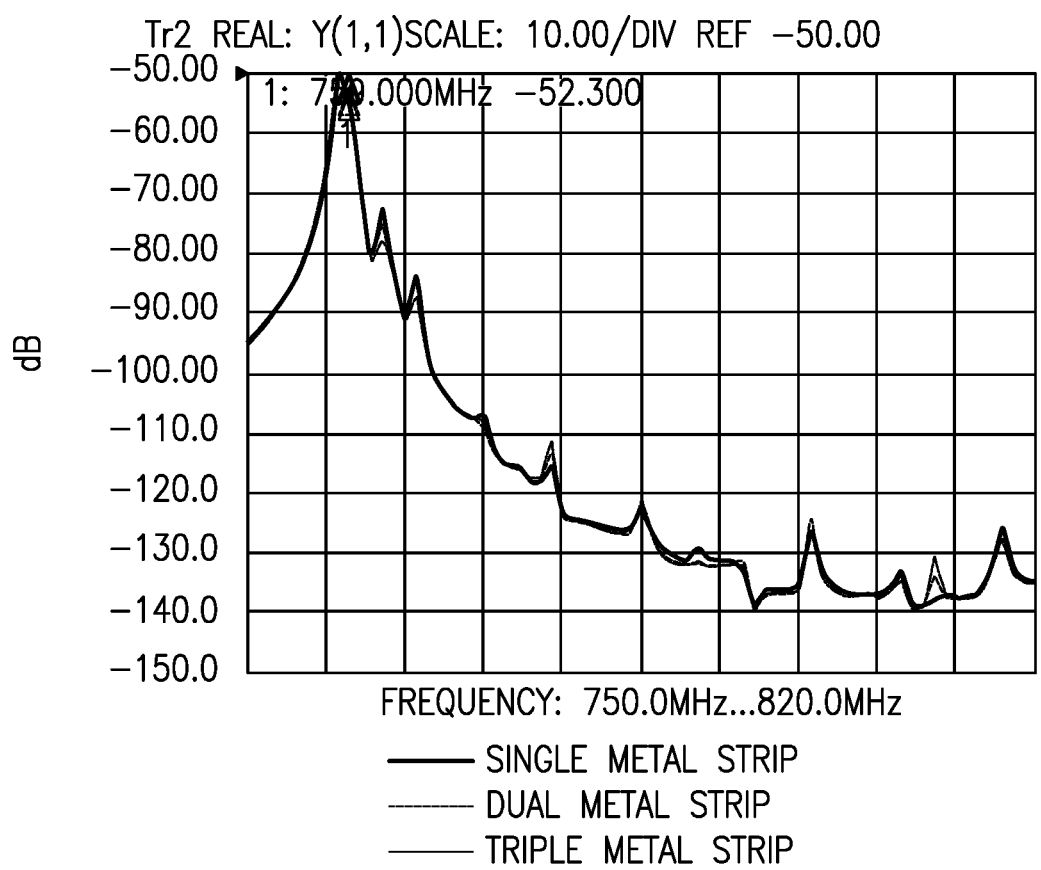
FIG. 13B illustrates results of a simulation of real admittance versus frequency for the different surface acoustic wave resonators of FIG. 12A but with the Mo strips replaced by W strips.
Figure 13C:
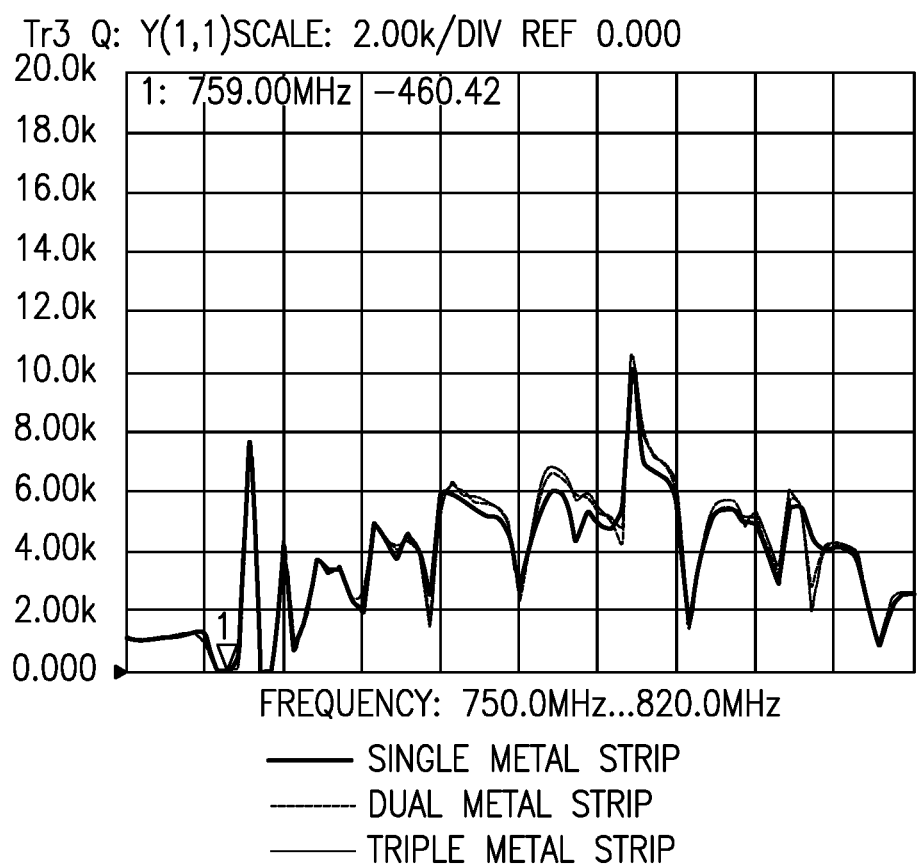
FIG. 13C illustrates results of a simulation of quality factor versus frequency for the different surface acoustic wave resonators of FIG. 12A but with the Mo strips replaced by W strips.

The simulations whose results are illustrated in FIGS. 12B-12D were repeated but with the high density material strips being simulated as formed from W. The results of these simulations are shown in FIGS. 13A-13C. Again, both the dual and triple metal strip embodiments suppressed spurious transverse signals better than the single metal strip embodiment, with the dual and triple metal strip embodiments exhibiting similar performance. Quality factor Q was degraded when using the W metal strips rather than the Mo metal strips, but was better for the dual metal strip and triple metal strip embodiments than for the single metal strip embodiment.

Figure 14:
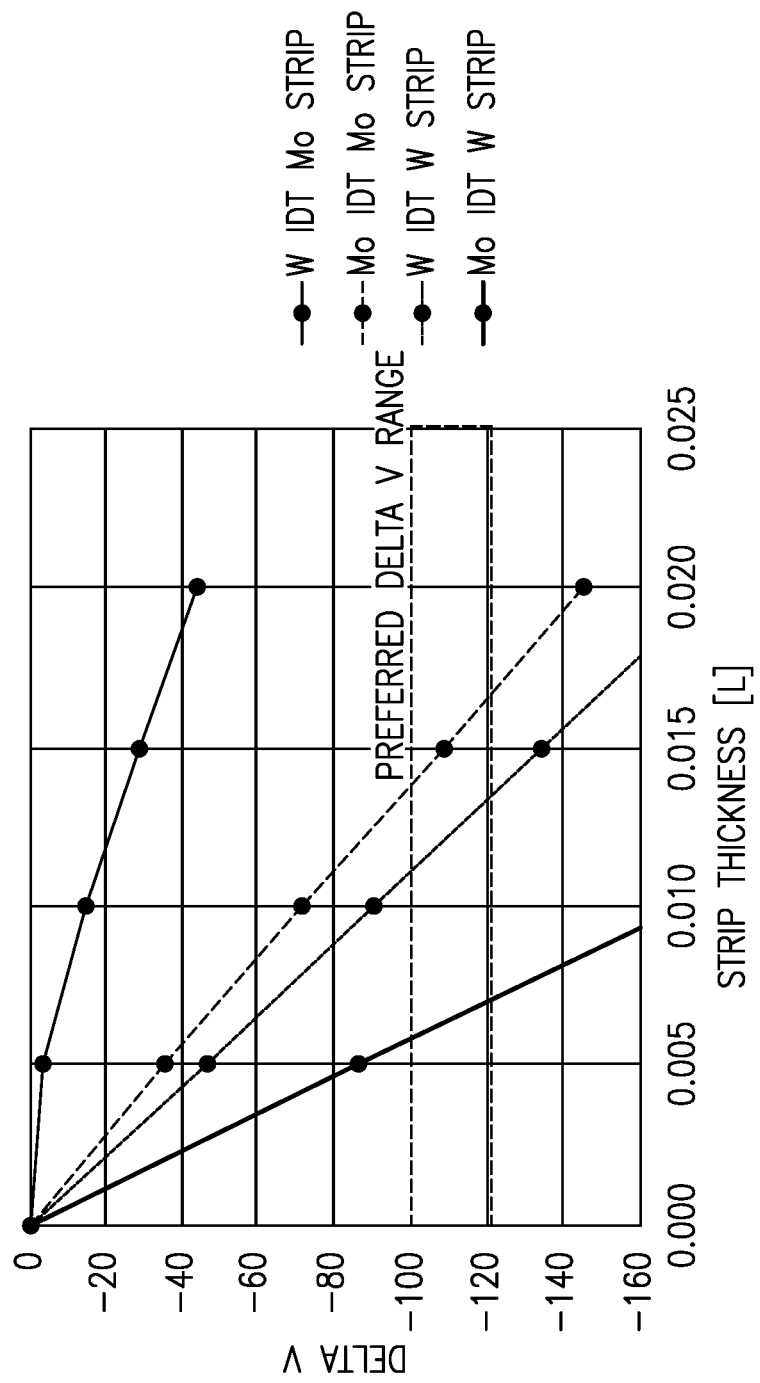
FIG. 14 illustrates changes in difference between acoustic velocities in the center and edge regions of a surface acoustic wave resonator as a function of interdigital transducer electrode and high density strip material and high density strip thickness.

Simulations were performed to determine how the materials and thicknesses of the IDT electrodes and the high density material strips effected the change in acoustic velocity in the edge regions as compared to the center regions of a SAW resonator with high density material strips within the layer of dielectric material 32 over the tips of the electrode fingers in the edge regions of the electrode structure as illustrated in FIG. 3. The IDT electrode fingers and high density material strips were both simulated as being either W or Mo. The results of these simulations are shown in FIG. 14, which includes a box indicating a region of desired acoustic velocity difference. In the embodiment in which the IDT electrodes were formed of W and the high density strips were formed of Mo, the difference in acoustic velocity did not reach the desired region even with Mo strips 0.20λ thick. It is believed that the Mo strips did not provide enough mass loading when using W IDT electrodes to significantly affect the velocity difference. In the embodiment in which the IDT electrodes were formed of Mo and the high density strips were formed of W, the difference in acoustic velocity changed rapidly with a change in high density material strip thickness. This rapid change in velocity difference with high density material strip thickness might introduce too much variability in acoustic velocity difference in different SAW resonators formed in a single process due to inherent process variations. In the embodiments in which both the IDT electrodes and high density strips were formed of the same material, either W or Mo, the simulated SAW devices exhibited a velocity difference in the desired range over a good range of high density material strip thicknesses.

Figure 15:
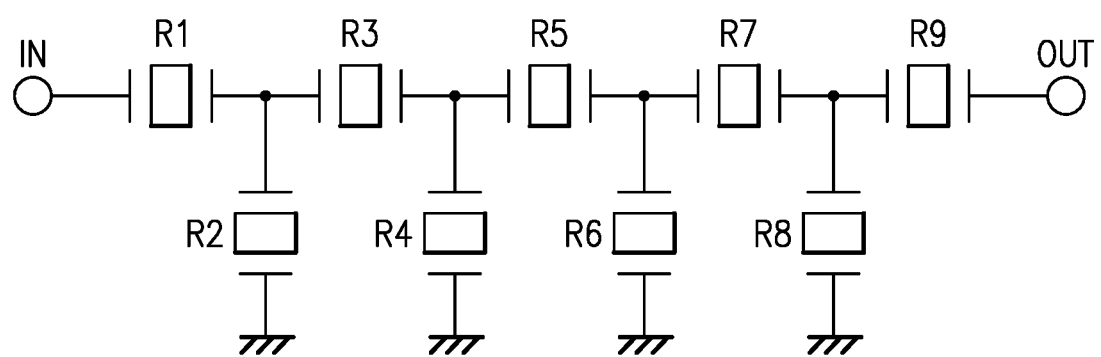
FIG. 15 is a schematic diagram of a radio frequency ladder filter.

In some embodiments, multiple SAW resonators as disclosed herein may be combined into a filter, for example, an RF ladder filter schematically illustrated in FIG. 15 and including a plurality of series resonators R1, R3, R5, R7, and R9, and a plurality of parallel resonators R2, R4, R6, and R8. As shown, the plurality of series resonators R1, R3, R5, R7, and R9 are connected in series between the input and the output of the RF ladder filter, and the plurality of parallel resonators R2, R4, R6, and R8 are respectively connected between series resonators and ground in a shunt configuration. Other filter structures and other circuit structures known in the art that may include SAW devices or resonators, for example, duplexers, baluns, etc., may also be formed including examples of SAW resonators as disclosed herein.

Figure 16:
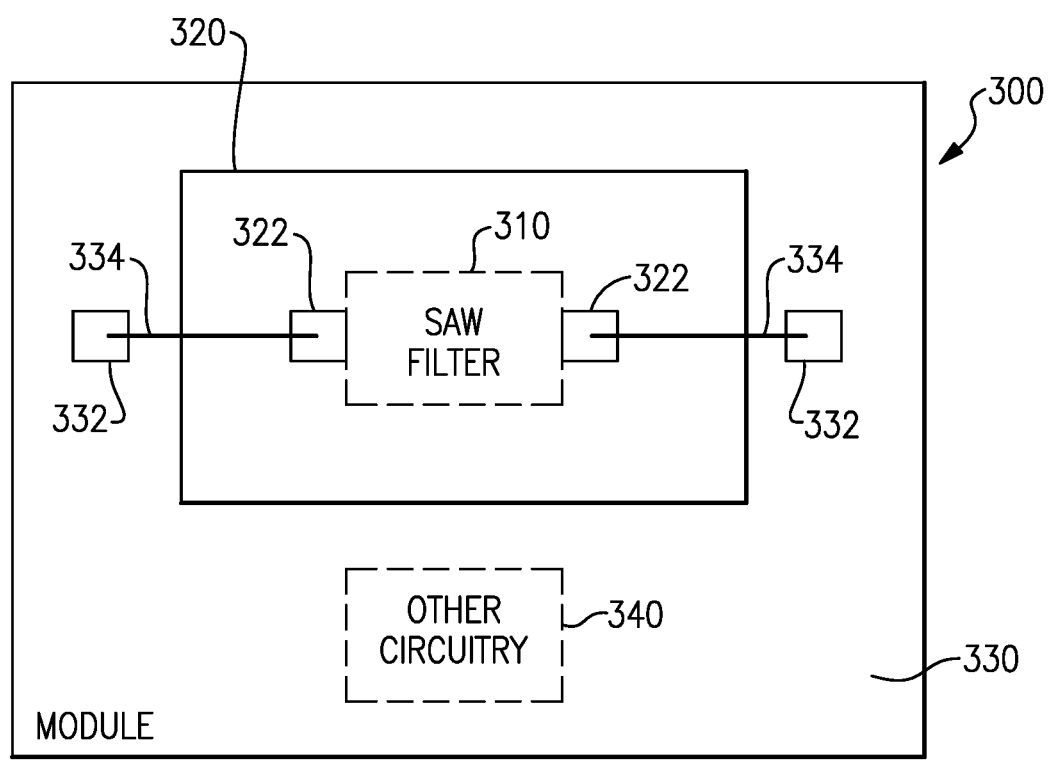
FIG. 16 is a block diagram of one example of a filter module that can include one or more surface acoustic wave resonators according to aspects of the present disclosure.
Figure 17:
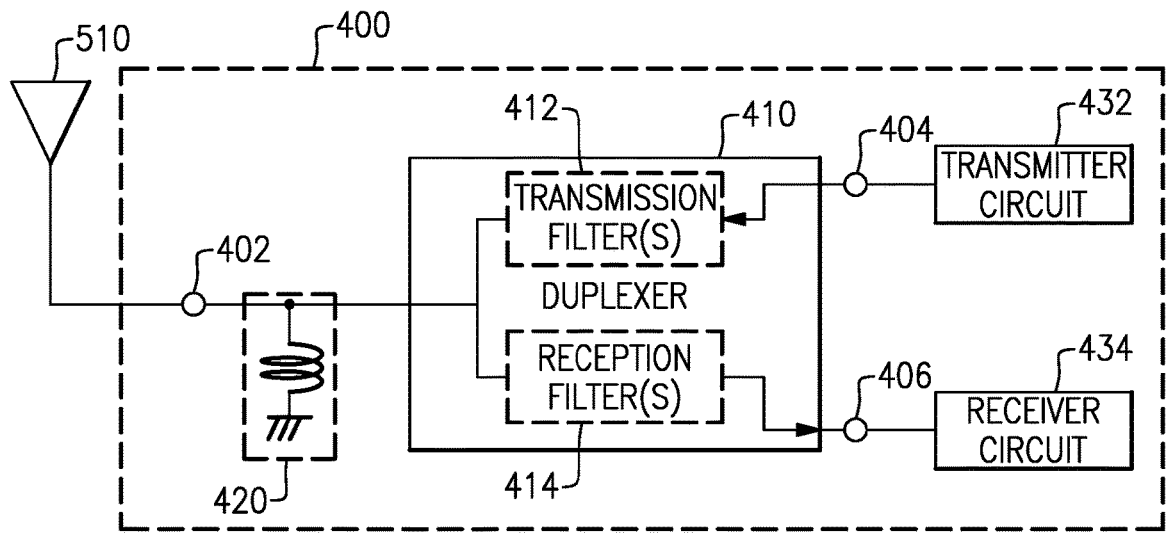
FIG. 17 is a block diagram of one example of a front-end module that can include one or more filter modules according to aspects of the present disclosure.
Figure 18:
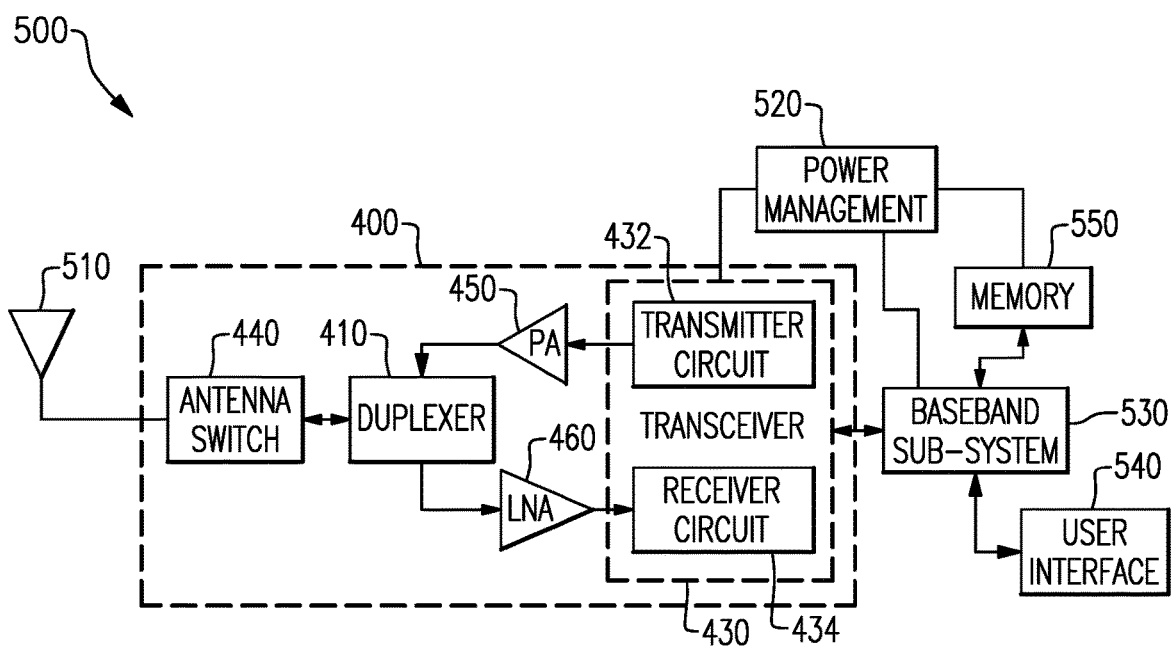
FIG. 18 is a block diagram of one example of a wireless device including the front-end module of FIG. 17.

The acoustic wave resonators discussed herein can be implemented in a variety of packaged modules. Some example packaged modules will now be discussed in which any suitable principles and advantages of the packaged acoustic wave resonators discussed herein can be implemented. FIGS. 16, 17, and 18 are schematic block diagrams of illustrative packaged modules and devices according to certain embodiments.

As discussed above, embodiments of the surface acoustic wave elements can be configured as or used in filters, for example. In turn, a surface acoustic wave (SAW) filter using one or more surface acoustic wave elements may be incorporated into and packaged as a module that may ultimately be used in an electronic device, such as a wireless communications device, for example. FIG. 16 is a block diagram illustrating one example of a module 300 including a SAW filter 310. The SAW filter 310 may be implemented on one or more die(s) 320 including one or more connection pads 322. For example, the SAW filter 310 may include a connection pad 322 that corresponds to an input contact for the SAW filter and another connection pad 322 that corresponds to an output contact for the SAW filter. The packaged module 300 includes a packaging substrate 330 that is configured to receive a plurality of components, including the die 320. A plurality of connection pads 332 can be disposed on the packaging substrate 330, and the various connection pads 322 of the SAW filter die 320 can be connected to the connection pads 332 on the packaging substrate 330 via electrical connectors 334, which can be solder bumps or wirebonds, for example, to allow for passing of various signals to and from the SAW filter 310. The module 300 may optionally further include other circuitry die 340, for example, one or more additional filter(s), amplifiers, pre-filters, modulators, demodulators, down converters, and the like, as would be known to one of skill in the art of semiconductor fabrication in view of the disclosure herein. In some embodiments, the module 300 can also include one or more packaging structures to, for example, provide protection and facilitate easier handling of the module 300. Such a packaging structure can include an overmold formed over the packaging substrate 330 and dimensioned to substantially encapsulate the various circuits and components thereon.

Various examples and embodiments of the SAW filter 310 can be used in a wide variety of electronic devices. For example, the SAW filter 310 can be used in an antenna duplexer, which itself can be incorporated into a variety of electronic devices, such as RF front-end modules and communication devices.

Referring to FIG. 17, there is illustrated a block diagram of one example of a front-end module 400, which may be used in an electronic device such as a wireless communications device (e.g., a mobile phone) for example. The front-end module 400 includes an antenna duplexer 410 having a common node 402, an input node 404, and an output node 406. An antenna 510 is connected to the common node 402.

The antenna duplexer 410 may include one or more transmission filters 412 connected between the input node 404 and the common node 402, and one or more reception filters 414 connected between the common node 402 and the output node 406. The passband(s) of the transmission filter(s) are different from the passband(s) of the reception filters. Examples of the SAW filter 310 can be used to form the transmission filter(s) 412 and/or the reception filter(s) 414. An inductor or other matching component 420 may be connected at the common node 402.

The front-end module 400 further includes a transmitter circuit 432 connected to the input node 404 of the duplexer 410 and a receiver circuit 434 connected to the output node 406 of the duplexer 410. The transmitter circuit 432 can generate signals for transmission via the antenna 510, and the receiver circuit 434 can receive and process signals received via the antenna 510. In some embodiments, the receiver and transmitter circuits are implemented as separate components, as shown in FIG. 17, however in other embodiments these components may be integrated into a common transceiver circuit or module. As will be appreciated by those skilled in the art, the front-end module 400 may include other components that are not illustrated in FIG. 17 including, but not limited to, switches, electromagnetic couplers, amplifiers, processors, and the like.

FIG. 18 is a block diagram of one example of a wireless device 500 including the antenna duplexer 410 shown in FIG. 17. The wireless device 500 can be a cellular phone, smart phone, tablet, modem, communication network or any other portable or non-portable device configured for voice or data communication. The wireless device 500 can receive and transmit signals from the antenna 510. The wireless device includes an embodiment of a front-end module 400 similar to that discussed above with reference to FIG. 17. The front-end module 400 includes the duplexer 410, as discussed above. In the example shown in FIG. 18 the front-end module 400 further includes an antenna switch 440, which can be configured to switch between different frequency bands or modes, such as transmit and receive modes, for example. In the example illustrated in FIG. 18, the antenna switch 440 is positioned between the duplexer 410 and the antenna 510; however, in other examples the duplexer 410 can be positioned between the antenna switch 440 and the antenna 510. In other examples the antenna switch 440 and the duplexer 410 can be integrated into a single component.

The front-end module 400 includes a transceiver 430 that is configured to generate signals for transmission or to process received signals. The transceiver 430 can include the transmitter circuit 432, which can be connected to the input node 404 of the duplexer 410, and the receiver circuit 434, which can be connected to the output node 406 of the duplexer 410, as shown in the example of FIG. 17.

Signals generated for transmission by the transmitter circuit 432 are received by a power amplifier (PA) module 450, which amplifies the generated signals from the transceiver 430. The power amplifier module 450 can include one or more power amplifiers. The power amplifier module 450 can be used to amplify a wide variety of RF or other frequency-band transmission signals. For example, the power amplifier module 450 can receive an enable signal that can be used to pulse the output of the power amplifier to aid in transmitting a wireless local area network (WLAN) signal or any other suitable pulsed signal. The power amplifier module 450 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 450 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 18, the front-end module 400 may further include a low noise amplifier module 460, which amplifies received signals from the antenna 510 and provides the amplified signals to the receiver circuit 434 of the transceiver 430.

The wireless device 500 of FIG. 18 further includes a power management sub-system 520 that is connected to the transceiver 430 and manages the power for the operation of the wireless device 500. The power management system 520 can also control the operation of a baseband sub-system 530 and various other components of the wireless device 500. The power management system 520 can include, or can be connected to, a battery (not shown) that supplies power for the various components of the wireless device 500. The power management system 520 can further include one or more processors or controllers that can control the transmission of signals, for example. In one embodiment, the baseband sub-system 530 is connected to a user interface 540 to facilitate various input and output of voice and/or data provided to and received from the user. The baseband sub-system 530 can also be connected to memory 550 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 5 GHz, such as in a range from about 600 MHz to 2.7 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave device comprising:
a substrate including a piezoelectric material;
interdigital transducer (IDT) electrodes including interdigitated electrode fingers disposed on a surface of the substrate, the IDT electrodes having gap regions, edge regions, and bus bar regions;
a first dielectric film having a lower surface disposed on the IDT electrodes and the surface of the substrate;
first strips formed of a first material having a density greater than a density of the first dielectric film disposed within the first dielectric film over tips of the interdigitated electrode fingers in the edge regions of the IDT electrodes; and
second strips formed of a second material having a density greater than the density of the first dielectric film disposed within the first dielectric film in the gap regions of the IDT electrodes, laterally spaced from the first strips in a direction perpendicular to a direction of propagation of a main acoustic wave through the acoustic wave device, and extending only partially over the gap regions to suppress high order spurious signals from being generated in the acoustic wave device.

2. The acoustic wave device of claim 1 wherein the first material is a same material as the second material.

3. The acoustic wave device of claim 1 wherein the first material and the second material are both metals.

4. The acoustic wave device of claim 3 wherein the first material and the second material are a same metal as a metal included in the IDT electrodes.

5. The acoustic wave device of claim 3 wherein the first material and the second material are different metals from a metal or metals included in the IDT electrodes.

6. The acoustic wave device of claim 4 wherein the first material and the second material are each dielectric materials.

7. The acoustic wave device of claim 1 wherein the second strips are narrower than the first strips.

8. The acoustic wave device of claim 7 wherein the second strips are laterally displaced from the first strips by a distance less than widths of the first strips.

9. The acoustic wave device of claim 8 wherein widths of the second strips are approximately the same as the distance.

10. The acoustic wave device of claim 1 wherein each of the first and second strips is disposed at a same height within the first dielectric film.

11. The acoustic wave device of claim 1 wherein the IDT electrodes further include min-bus bar electrodes and the second strips are disposed over the mini-bus bar electrodes.

12. The acoustic wave device of claim 1 further comprising third strips formed of a third material having a density greater than the density of the first dielectric film disposed within the first dielectric film in the gap regions of the IDT electrodes, laterally spaced from the first strips and from the second strips in a direction perpendicular to the direction of propagation of the main acoustic wave through the acoustic wave device, a sum of the widths of second strips and third strips being less than a width of the gap region.

13. The acoustic wave device of claim 12 further comprising fourth strips formed of a fourth material having a density greater than the density of the first dielectric film disposed within the first dielectric film in the gap regions of the IDT electrodes, laterally spaced from the first strips, the second strips, and the third strips in a direction perpendicular to the direction of propagation of the main acoustic wave through the acoustic wave device, a sum of the widths of second strips, third strips, and fourth strips being less than the width of the gap region.

14. The acoustic wave device of claim 13 wherein each of the first, second, third, and fourth materials is formed from a same material.

15. The acoustic wave device of claim 13 wherein the fourth strips have edges disposed at boundaries between the gap regions and the bus bar regions.

16. The acoustic wave device of claim 13 wherein each of the second, third, and fourth strips has a same width.

17. The acoustic wave device of claim 13 wherein each of the first, second, third, and fourth strips is laterally spaced from adjacent others of the first, second, third, and fourth strips by a same distance.

18. The acoustic wave device of claim 13 wherein at least two of the first, second, third, and fourth strips are disposed at a same height within the first dielectric film.

19. The acoustic wave device of claim 18 wherein each of the first, second, third, and fourth strips is disposed at a same height within the first dielectric film.

20. The acoustic wave device of any claim 1 further comprising a second dielectric film exhibiting a greater acoustic velocity than the first dielectric film disposed on the first dielectric film.

21. A radio frequency filter comprising as acoustic wave device of claim 1.

22. An electronics module comprising the radio frequency filter of claim 21.

23. An electronic device including the electronics module of claim 22.

* * * * *